(12) United States Patent
Winslow

(10) Patent No.: US 11,734,318 B1
(45) Date of Patent: Aug. 22, 2023

(54) SUPERINDEXING SYSTEMS AND METHODS

(71) Applicant: Era Software, Inc., Bainbridge Island, WA (US)

(72) Inventor: Robert Winslow, Oakland, CA (US)

(73) Assignee: ServiceNow, Inc., Santa Clara, CA (US)

( * ) Notice: Subject to any disclaimer, the term of this patent is extended or adjusted under 35 U.S.C. 154(b) by 0 days.

(21) Appl. No.: 18/053,728

(22) Filed: Nov. 8, 2022

Related U.S. Application Data

(60) Provisional application No. 63/277,150, filed on Nov. 8, 2021, provisional application No. 63/277,128, filed on Nov. 8, 2021.

(51) Int. Cl.
| | |
|---|---|
| *G06F 16/00* | (2019.01) |
| *G06F 16/31* | (2019.01) |
| *G06F 16/33* | (2019.01) |
| *G06F 16/35* | (2019.01) |
| *G06F 16/22* | (2019.01) |

(Continued)

(52) U.S. Cl.
CPC .......... *G06F 16/31* (2019.01); *G06F 16/2246* (2019.01); *G06F 16/3346* (2019.01); *G06F 16/353* (2019.01); *G06F 16/319* (2019.01); *G06F 18/2321* (2023.01); *G06F 18/2413* (2023.01); *G06F 30/27* (2020.01); *G06F 40/44* (2020.01)

(58) Field of Classification Search
CPC .... G06F 16/2246; G06F 16/31; G06F 16/319; G06F 16/3346; G06F 16/353; G06F 18/2321; G06F 18/2413; G06F 30/27; G06F 40/44
See application file for complete search history.

(56) References Cited

U.S. PATENT DOCUMENTS

| | | |
|---|---|---|
| 6,438,562 B1 | 8/2002 | Gupta |
| 6,718,338 B2 | 4/2004 | Vishnubhotla |

(Continued)

OTHER PUBLICATIONS

Kraska, T. et al. (Jun. 10-15, 2018). "The Case for Learned Index Structures", SIGMOD'18, Houston, TX, US, https://doi.org/10.1145/3183713.3196909.

(Continued)

*Primary Examiner* — Diedra McQuitery
(74) *Attorney, Agent, or Firm* — McDonnell Boehnen Hulbert & Berghoff, LLP

(57) ABSTRACT

Embodiments of the present disclosure are directed to systems and methods for managing a database and performing database operations. An exemplary method in accordance with embodiments of this disclosure comprises: receiving a request to perform one or more database operations on a dataset comprising one or more data items; inputting the dataset into a statistical model, wherein the statistical model is configured to identify one or more storage locations associated with the one or more data items based on a similarity between one or more properties of the one or more data items; receiving the one or more storage locations associated with the one or more data items; updating the one or more data items based on the received one or more storage locations; and performing the one or more database operations on the one or more updated data items based on the one or more storage locations.

19 Claims, 25 Drawing Sheets

(51) Int. Cl.
*G06F 40/44* (2020.01)
*G06F 18/2321* (2023.01)
*G06F 30/27* (2020.01)
*G06F 18/2413* (2023.01)

(56) References Cited

U.S. PATENT DOCUMENTS

| | | | |
|---|---|---|---|
| 7,437,349 | B2 | 10/2008 | Basu |
| 7,743,077 | B2 | 6/2010 | Gaurav |
| 8,380,714 | B2 | 2/2013 | Inagaki |
| 9,122,722 | B2 | 9/2015 | Collins |
| 9,852,377 | B1 * | 12/2017 | Kumar ............... G06N 5/04 |
| 10,127,285 | B2 | 11/2018 | Vuppala |
| 10,402,379 | B2 | 9/2019 | Riggs |
| 10,474,701 | B2 | 11/2019 | Ebaugh |
| 10,853,162 | B2 | 12/2020 | Haridas |
| 10,853,728 | B1 * | 12/2020 | Walters ............... G06N 3/084 |
| 10,956,448 | B2 | 3/2021 | Bernhardy |
| 11,341,126 | B2 | 5/2022 | Panuganty |
| 2015/0317349 | A1 | 11/2015 | Chao |
| 2015/0347484 | A1 | 12/2015 | Klauke |
| 2016/0117361 | A1 | 4/2016 | Boyle |
| 2017/0109352 | A1 * | 4/2017 | Aronovich ......... G06F 16/2386 |
| 2017/0161352 | A1 | 6/2017 | Horii |
| 2019/0108248 | A1 | 4/2019 | Rajan |
| 2019/0209022 | A1 * | 7/2019 | Sobol ................ A61B 5/0022 |
| 2021/0103838 | A1 * | 4/2021 | Yuan ................. G06F 18/23 |
| 2021/0216520 | A1 | 7/2021 | Wang |
| 2021/0224687 | A1 * | 7/2021 | Goldszmidt ....... G06F 18/2415 |
| 2021/0334664 | A1 * | 10/2021 | Li .................... G06V 20/20 |
| 2023/0049969 | A1 * | 2/2023 | Bolikowski ........ G06F 16/2228 |

OTHER PUBLICATIONS

U.S. Appl. No. 17/681,569, filed Feb. 25, 2022.
U.S. Appl. No. 18/053,735, filed Nov. 8, 2022.
Office Action, U.S. Appl. No. 18/053,735, dated Mar. 10, 2023.

* cited by examiner

INPUT DATA 301

```
{"id": "0", "n": 0,   "name": "a"},
{"id": "1", "n": 100, "name": "b", "timeout": 3},
{"id": "2", "n": 200, "name": "c"}
```

FIG. 3A

KEY-VALUE MAP 307

```
id:0
id:1
id:2
n:0
n:100
n:200
name:a
name:b
name:c
timeout:3
```

FIG. 3B

INPUT DATA 401

```
{"id": "10", "reading": 99,  "type": "a"}
{"id": "20", "reading": 99,  "type": "z", "delay": 3},
{"id": "30", "reading": 100, "type": "z"}
```

FIG. 4A

INVERTED INDEX 403

```
"reading": {
    "99":  [10, 20],
    "100": [30]
},
"type": {
    "a": [10],
    "z": [20, 30]
},
"delay": {
    "3": [20]
}
```

FIG. 4B

COLUMN STORAGE 405

```
"reading:99":  [10, 20],
"reading:100": [30],
"type:a": [10],
"type:z": [20, 30],
"delay:3": [20]
```

FIG. 4C

KEY-VALUE MAP 407

```
delay:3:20
reading:100:30
reading:99:10
reading:99:20
type:a:10
type:z:20
type:z:30
```

FIG. 4D

INPUT DATA 501

```
"id": 0,
"timestamp": "January 1st, 12am, 2019 UTC",
"text": "quick fox"

"id": 1,
"timestamp": "January 2nd, 12pm, 2019 UTC",
"text": "red foxes"
```

FIG. 5A

PROCESSED DATA 511

```
"id": 0,                          "id": 1,
"timestamp": 1546329600,          "timestamp": 1546459200,
"text": [                         "text": [
    "qui",                            "red",
    "uic",                            "ed ",
    "ick",                            "d f",
    "ck ",                            " fo",
    "k f",                            "fox",
    " fo",                            "oxe",
    "fox"                             "xes"
]                                 ]
```

FIG. 5B

SORTED KEY-VALUE MAP 507

```
text:" fo":0
text:" fo":1
text:"ck ":0
text:"d f":1
text:"ed ":1
text:"fox":0
text:"fox":1
text:"ick":0
text:"k f":0
text:"oxe":1
text:"qui":0
text:"red":1
text:"uic":0
text:"xes":1
timestamp:1546329600:0
timestamp:1546459200:1
```

FIG. 5D

UNSORTED KEY-VALUE SETS 509

```
timestamp:1546329600:0
text:"qui":0
text:"uic":0
text:"ick":0
text:"ck ":0
text:"k f":0
text:" fo":0
text:"fox":0
timestamp:1546459200:1
text:"red":1
text:"ed ":1
text:"d f":1
text:" fo":1
text:"fox":1
text:"oxe":1
text:"xes":1
```

FIG. 5C

INPUT DATA 601

```
"id": 0,
"environment": "staging",
"timestamp": 10,
"a": 0.1,
"b": 1.3,
"c": true "id": 1,
"environment": "production",
"timestamp": 20,
"a": 0.3,
"b": 4.1,
"c": true "id": 2,
"environment": "production",
"timestamp": 30,
"a": -10,
"b": 0,
"c": false
```

FIG. 6A

UNSORTED KEY-VALUE SETS 609

```
timestamp:10:0
timestamp:20:1
timestamp:30:2
environment:staging:0
environment:production:1
environment:production:2
a:0.1:0
a:0.3:1
a:-10:2
b:1.3:0
b:4.1:1
b:0:2
c:true:0
c:true:1
c:false:2
```

FIG. 6B

KEY-VALUE MAP 607

```
a:-10:2
a:0.1:0
a:0.3:1
b:0:2
b:1.3:0
b:4.1:1
c:false:2
c:true:0
c:true:1
environment:production:1
environment:production:2
environment:staging:0
timestamp:10:0
timestamp:20:1
timestamp:30:2
```

FIG. 6C

INPUT DATA 701

```
"id": 0,
"a": {
    "b": "foo"
},
"c": false
```
```
"id": 1,
"a": {
    "b": "bar"
},
"c": 42
```
```
"id": 2,
"a": "z",
"d": [
    "xyz",
    123
]
```
```
"id": 3,
"abc": null
```

FIG. 7A

UNSORTED KEY-VALUE SETS 709

```
map:a:map:b:string:foo:0
map:c:string:foo:0
map:a:map:b:string:bar:1
map:c:number:42:1
map:a:string:z:2
map:a:map:b:array:string:xyz:2
map:a:map:b:array:number:123:2
map:abc:null:3
```

FIG. 7B

SORTED KEY-VALUE MAP 707

```
map:a:map:b:array:number:123:2
map:a:map:b:array:string:xyz:2
map:a:map:b:string:bar:1
map:a:map:b:string:foo:0
map:a:string:z:2
map:abc:null:3
map:c:number:42:1
map:c:string:foo:0
```

FIG. 7C

METADATA STORE 813

```
"bar": 1234
"baz": 5678
"foo": 9012
```

FIG. 8A

INPUT DATA 801

KEY-VALUE MAP 807

```
bar:1
baz:100
foo:10000
```

FIG. 8C

INPUT DATA 1210

"object_id": 67890

Type: "write_request"
Tags:
    "session-uuid": "e39bf8a6-d41c-44e9-afdb-095c270f6862"
    "environment": "production"
    "application": "load_balancer"
    "disk_type": "nvme"
    "status_code": 502
Values:
[ "2019-06-17T00:00:00-00:00", 100.0 ]
[ "2019-06-17T00:00:10-00:00", 99.5 ]
[ "2019-06-17T00:00:20-00:00", 50.0 ]
[ "2019-06-17T00:00:30-00:00", 25.0 ]
[ "2019-06-17T00:00:40-00:00", 4.2 ]

"object_id": 12345

Type: "write_request"
Tags
    "session-uuid": "3a65a958-010e-4da0-b04e-cc3be1861833"
    "environment": "production"
    "application": "frontend"
    "disk_type": "ssd"
    "status_code": 400
Values
["2019-06-17T00:00:04-00:00", 50],
["2019-06-17T00:00:13-00:00", 60],
["2019-06-17T00:00:22-00:00", 70],
["2019-06-17T00:00:32-00:00", 42],
["2019-06-17T00:00:40-00:00", 20],
["2019-06-17T00:00:42-00:00", 100]

"object_id": 1111

Type: "write_request"
Tags:
    "session-uuid": "3a65a958-010e-4da0-b04e-cc3be1861833"
    "environment": "production"
    "application": "worker_5"
    "disk_type": "nvme"
    "status_code": 200
Values:
[ "2019-06-17T00:00:02-00:00", 0.0 ]
[ "2019-06-17T00:00:13-00:00", 0.5 ]
[ "2019-06-17T00:00:22-00:00", 0.0 ]
[ "2019-06-17T00:00:33-00:00", 0.0 ]
[ "2019-06-17T00:00:42-00:00", 0.2 ]

FIG. 12A

OUTPUT 1230

Type: "write_request"

Objects:
    "object_id": 67890
    "cluster_id": 100

"object_id": 12345
    "cluster_id": 999

"object_id": 1111
    "cluster_id": 100

FIG. 12B

POST EXECUTEION STORAGE STATE 1240C

Type: "write_request"

Post-execution storage state:
    "shard_100": [
      { "object_id": 1111, ... }
      { "object_id": 67890, ... }
    ]

"shard_999": [
      { "object_id": 12345}
    ]

FIG. 12C

POST EXECUTEION STORAGE STATE 1240D

Type: "write_request"

Post-execution storage state:
    "shard_0": [
      { "object_id": 67890, ... }
    ]

"shard_1": [
      { "object_id": 1111, ... }
      { "object_id": 12345 }
    ]

FIG. 12D

COLLECTED OBSERVATIONS 1250

"object_id": 67890

Tags:
"session-uuid": "e39bf8a6-d41c-44e9-afdb-095c270f6862"
"environment": "production"
"application": "load_balancer"
"disk_type": "nvme"
"status_code": 502

"object_id": 12345

Tags
"session-uuid": "3a65a958-010e-4da0-b04e-cc3be1861833"
"environment": "production"
"application": "frontend"
"disk_type": "ssd"
"status_code": 400

"object_id": 1111

Tags:
"session-uuid": "6ab552b3-6046-4361-87a8-69de12109976"
"environment": "production"
"application": "worker_5"
"disk_type": "nvme"
"status_code": 200

FIG. 12E

Example: Storing a set of documents

Example: Storing a set of images

Example: Storing set of strings

Example: Storing a high dimensionality dataset

Training Data 1612

"object_id": 67890

Tags:
　　"session-uuid": "6d1e5ab0-5481-455f-a19f-7c3f5ceab597"
　　"environment": "staging"
　　"application": "queue"
　　"disk_type": "hdd"
　　"error_code": 500

"object_id": 12345

Tags:
　　"session-uuid": "10fc9e98-82f0-40f9-87e9-b3884640202c"
　　"environment": "production"
　　"application": "load_balancer"
　　"disk_type": "ssd"
　　"error_code": 402

FIG. 16A

OUTPUT 1630

Objects:
　　"cluster_id": 4000
　　"cluster_id": 42

FIG. 16B

SUPERINDEXING SYSTEMS AND METHODS

CROSS-REFERENCE TO RELATED APPLICATIONS

This application claims priority to and the benefit of U.S. Provisional Patent Application No. 63/277,128, filed Nov. 8, 2021, and U.S. Provisional Patent Application No. 63/277,150, filed Nov. 8, 2021, disclosure of which are herein incorporated by reference in their entirety.

FIELD OF DISCLOSURE

The present disclosure relates generally to systems and methods for managing a database, and more specifically to systems and methods for efficiently storing and retrieving data from a database.

BACKGROUND

Recent years have seen an explosion in the production and collection of data. The data collected can produce relatively large and complex data stores that consume a significant amount of storage. Users often access the data via queries to identify data and/or process the data to produce various statistics and metrics. However, as the volume and/or complexity of data increases, storing and accessing the data to perform such queries can result in slow searches that consume processing power.

For example, as the volume of data stored to a database increases, the inefficiencies associated with storing and retrieving data in a conventional database also increases. For example, a conventional database for storing documents may store these documents based on an internal identifier (such as image URL), a hash value, or some other arbitrary property of the document. If this database includes millions of documents stored over multiple storage blocks, the documents are generally stored randomly across these storage blocks (e.g., stored without accounting for the content of the documents). When the system database receives a client request to access one or more documents based on a client query, the database accesses multiple blocks of storage to fetch the documents responsive to the client query. However, most of the documents fetched from the block may not be responsive to the client query. These random storage and access operations result in a number of inefficiencies when storing and accessing data from the database, including read latency, write latency, unbalanced storage blocks, and increased processing power usage.

Accordingly, there is a need to provide a database structure to efficiently store and retrieve data based on properties that are associated with data objects stored in the database.

BRIEF SUMMARY

Embodiments of the present disclosure are directed to systems and methods for using a predictive system to enhance database operations, such as, but not limited to write or storage operations. Embodiments of the present disclosure introduce a new approach that solves problems associated with managing and searching large and complex data structures, particularly with respect to storing data within the database. Without loss of generality, methods according to embodiments of this disclosure may be used to accomplish some or all the following objectives:

Methods disclosed herein improve traditional data structures used in databases. Embodiments of the present disclosure use a statistical model to augment or replace traditional data structures, and/or generate customized and optimized versions of those data structures from scratch for each dataset encountered in the database.

Embodiments disclosed herein incorporate the use of machine learning and deep learning to improve performance, increase efficiency, and automate away manual system management of databases. For example, using a deep learning model that takes as input observations of database operations and their outcomes (such as observing query patterns, disk latencies, and so on), and outputting data migration command (such as a command to "move value X from storage location A to memory location B").

Embodiments of the present disclosure are directed to systems and methods for managing a database and performing database operations. An exemplary method in accordance with embodiments of this disclosure comprises: receiving a request to perform one or more database operations on a dataset comprising one or more data items; inputting the dataset into a statistical model, wherein the statistical model is configured to identify one or more storage locations associated with the one or more data items based on a similarity between one or more properties of the one or more data items; receiving the one or more storage locations associated with the one or more data items; updating the one or more data items based on the received one or more storage locations; and performing the one or more database operations on the one or more updated data items.

In one or more embodiments, the one or more database operations comprises a storage operation. In one or more embodiments, the method further comprises generating a database indexing structure based on the received one or more storage locations.

In one or more embodiments, the statistical model is configured to group the one or more data items into one or more clusters based on the similarity between the one or more properties; and wherein the one or more storage locations is further based on a relationship. between the one or more clusters.

In one or more embodiments, the method further comprises determining a property of a data item of the one or more data items. In one or more embodiments, determining the property comprises inputting the one or more data items into a second statistical model to determine the property. In one or more embodiments, the property comprises at least one of a content of the data item, a term frequency-inverse document frequency (TF-IDF) of the data item, a value indicative of a textual similarity of the data item to a second data item, a likelihood of co-occurrence of the one or more data items in a client query, or a combination thereof. In one or more embodiments, the similarity between the one or more properties of the one or more data items comprises a likelihood of co-occurrence of the one or more data items in a client query.

In one or more embodiments, the method further comprises collecting one or more performance metrics of the statistical model based on at least one of a performance of the statistical model during the storing the one or more updated data items and a performance of the statistical model during a subsequent database operation. In one or more embodiments, the method further comprises training the statistical model based on the collected one or more performance metrics. In one or more embodiments, the statistical model is an untrained statistical model.

In one or more embodiments, the method further comprises inputting training inputs into an untrained statistical model; and training the untrained statistical model using the training inputs to obtain the statistical model. In one or more embodiments, the training inputs comprises one or more model structures, one or more prior beliefs, training data, one or more objective functions, one or more database operations, and one or more training procedures.

In one or more embodiments, the one or more model structures comprise a clustering model, a regression model, a classification model, a reinforcement learning model, a deep learning model, a Bayesian network model, a sampling model, or a combination thereof. In one or more embodiments, the one or more prior beliefs comprise an expected distribution of data, constraints placed on the statistical model, or a combination thereof. In one or more embodiments, the training data corresponds to a first data type and the dataset corresponds to a second data type, the second data type different from the first data type.

Embodiments of the present disclosure further comprise systems for managing a database. An exemplary system can comprise: one or more processors; a memory; and one or more programs, wherein the one or more programs are stored in the memory and configured to be executed by the one or more processors. In some embodiments, the one or more programs include instructions for: receiving a request to perform one or more database operations on a dataset comprising one or more data items; inputting the dataset into a statistical model, wherein the statistical model is configured to identify one or more storage locations associated with the one or more data items based on a similarity between one or more properties of the one or more data items; receiving the one or more storage locations associated with the one or more data items; updating the one or more data items based on the received one or more storage locations; and performing the one or more database operations on the one or more updated data items.

Embodiments of the present disclosure further comprise non-transitory computer-readable storage mediums storing one or more programs. In some examples, the one or more programs comprise instructions, which when executed by one or more processors of one or more electronic devices, cause the electronic devices to perform a method comprising: receiving a request to perform one or more database operations on a dataset comprising one or more data items; inputting the dataset into a statistical model, wherein the statistical model is configured to identify one or more storage locations associated with the one or more data items based on a similarity between one or more properties of the one or more data items; receiving the one or more storage locations associated with the one or more data items; updating the one or more data items based on the received one or more storage locations; and performing the one or more database operations on the one or more updated data items.

DESCRIPTION OF THE FIGURES

FIGS. 3A-3B illustrate an exemplary dataset and storage technique, in accordance with some embodiments of this disclosure.

FIGS. 4A-4D illustrate an exemplary dataset and storage techniques, in accordance with some embodiments of this disclosure.

FIGS. 5A-5D illustrate an exemplary dataset and storage technique, in accordance with some embodiments of this disclosure.

FIGS. 6A-6C illustrate an exemplary dataset and storage technique, in accordance with some embodiments of this disclosure.

FIGS. 7A-7C illustrate an exemplary dataset and storage technique, in accordance with some embodiments of this disclosure.

FIGS. 8A-8C illustrate an exemplary dataset and storage techniques, in accordance with some embodiments of this disclosure.

FIG. 12A illustrates exemplary input data to a statistical model, in accordance with some embodiments of this disclosure.

FIG. 12B illustrates exemplary output data from a statistical model, in accordance with some embodiments of this disclosure.

FIG. 12C illustrates an exemplary storage state, in accordance with some embodiments of this disclosure.

FIG. 12D illustrates an exemplary storage state, in accordance with some embodiments of this disclosure.

FIG. 12E illustrates exemplary collected observations, in accordance with some embodiments of this disclosure.

FIG. 16A illustrates exemplary training data for training a statistical model, in accordance with some embodiments of this disclosure.

FIG. 16B illustrates exemplary outputs from a statistical model, in accordance with some embodiments of this disclosure.

DETAILED DESCRIPTION

Figure 1A:
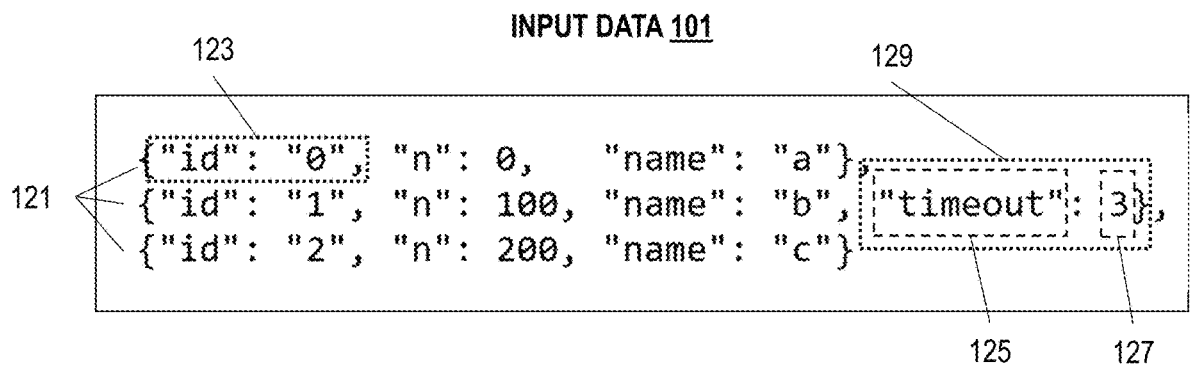
FIGS. 1A-1C illustrate an exemplary dataset and storage techniques, in accordance with some embodiments of this disclosure.

Recent years have seen an explosion in the production and collection of data. The data collected can produce relatively large and complex data stores that consume a significant amount of storage. Users often access the data via queries to identify data and/or process the data to produce various statistics and metrics. However, as the volume and/or complexity of data increases, accessing the data to perform such queries can result in slow searches that consume processing power.

For example, as the volume of data stored to a database increases, the inefficiencies associated with storing and retrieving data in a conventional database also increases. For example, a conventional database for storing documents may store these documents based on an internal identifier (such as image URL), a hash value, or some other arbitrary property of the document. If this database includes millions of documents stored over multiple storage blocks, the documents are stored randomly across these storage blocks. When the system database receives a client request to access one or more documents based on a client query, the database access multiple blocks of storage to fetch the documents responsive to the client query, where most of the documents fetched from the block may not be responsive to the client query. These random storage and access operations result in a number of inefficiencies when storing and accessing data from the database, including read latency, write latency, unbalanced storage blocks, and increased processing power consumption.

The following description is presented to enable a person of ordinary skill in the art to make and use the various embodiments. Descriptions of specific devices, techniques, and applications are provided only as examples. Various modifications to the examples described herein will be readily apparent to those of ordinary skill in the art, and the general principles defined herein may be applied to other examples and applications without departing from the spirit and scope of the various embodiments. Thus, the various embodiments are not intended to be limited to the examples described herein and shown, but are to be accorded the scope consistent with the claims.

Embodiments of the present disclosure are directed to systems and methods for using a predictive system to enhance database operations, such as, but not limited to write or storage operations. Embodiments of the present disclosure introduce a new approach that solves problems associated with managing and searching large and complex data structures, particularly with respect to storing data within the database. Without loss of generality, methods according to embodiments of this disclosure may be used to accomplish some or all the following objectives. In some instances, embodiments of the present disclosure may be practiced with the U.S. Patent Application entitled "Maximally Distributed Minimally Coordinated Systems and Methods" filed on Nov. 8, 2022 by Era Software, Inc., which is incorporated by reference herein in its entirety.

Methods disclosed herein improve traditional data structures used in databases. Embodiments of the present disclosure use a statistical model to augment or replace traditional data structures, and/or generate customized and optimized versions of those data structures from scratch for each dataset encountered in the database.

Embodiments disclosed herein incorporate the use of machine learning and deep learning to improve performance, increase efficiency, and automate away manual system management of databases. For example, using a deep learning model that takes as input observations of database operations and their outcomes (such as observing query patterns, disk latencies, and so on), and outputting data migration command (such as a command to "move value X from storage location A to memory location B").

Although the following description uses terms "first," "second," etc. to describe various elements, these elements should not be limited by the terms. These terms are only used to distinguish one element from another. For example, a first graphical representation could be termed a second graphical representation, and, similarly, a second graphical representation could be termed a first graphical representation, without departing from the scope of the various described embodiments. The first graphical representation and the second graphical representation are both graphical representations, but they are not the same graphical representation.

The terminology used in the description of the various described embodiments herein is for the purpose of describing particular embodiments only and is not intended to be limiting. As used in the description of the various described embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The term "if" is, optionally, construed to mean "when" or "upon" or "in response to determining" or "in response to detecting," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]," depending on the context.

Database Indexing

Embodiments of the present disclosure provide systems and methods for managing a database and providing data retrieval. In one or more examples, embodiments of the present disclosure can address the metadata storage scaling problems by removing the need to maintain a metadata store altogether. In other words, the data can be stored and retrieved without accessing a metadata store. In one or more examples, systems and methods according to this disclosure can store input data in a key-value map. The key-value map includes a plurality of ordered key-value sets. The key-value map stores the input data with information that would traditionally be stored in a separate metadata store.

For example, in traditional databases, one use of data stores is to evaluate specific or "narrow" queries on a large number of items, e.g., a database of items, where, for many items in the database, the system can extract out a few field values, then aggregate all of the values into a result. Traditional row-oriented data stores can serve this use case correctly, but very slowly, because the system fetches additional, extraneous field values from storage. A common alternative is to use a column-oriented data store, which stores the values of each field in separate data structures, to attempt to improve the efficiency of query processing by improving the relevance of the data fetched from storage. While the column-oriented approach may sometimes speed up operations, it comes at the cost of scaling poorly when the dataset becomes complex.

Figure 1B:
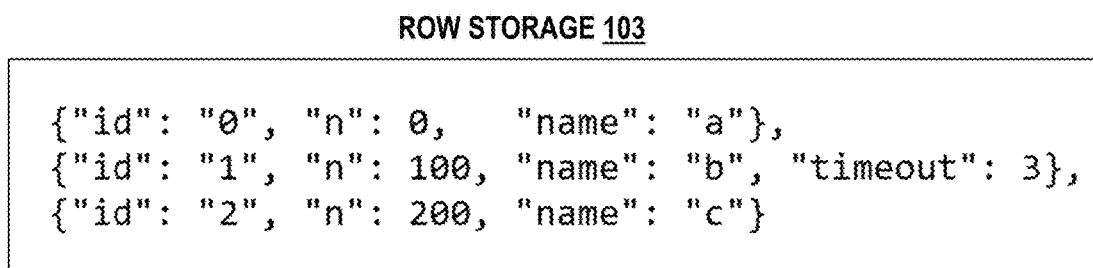
Figure 1C:
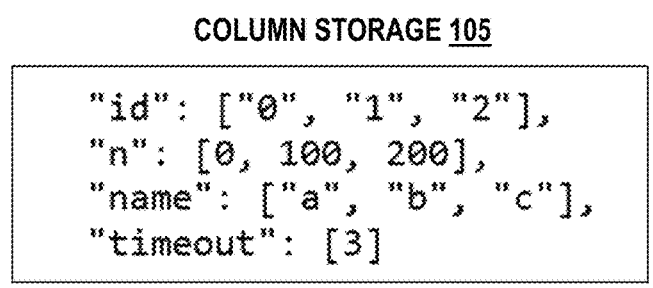

FIGS. 1A-1C illustrate the differences between raw data and row and column storage techniques, in accordance with some embodiments. FIG. 1A illustrates exemplary raw data 101. In one or more examples, the raw data 101 can correspond to data presented in a table, e.g., Table 1. As shown in the figure, the raw data 101 may include three data entries 121. Each data entry can include one or more data items such as 123 and 129, where each data item can further include a field name 125 and a corresponding field value 127. In one or more examples, at least one of the data items in the data entry can be an identifier item 123, where the field name corresponds to the identifier field and the field value corresponds to the identifier value.

TABLE 1

| id | n | name | timeout |
|---|---|---|---|
| 0 | 0 | a | |
| 1 | 100 | b | 3 |
| 2 | 200 | c | |

FIG. 1B illustrates exemplary row oriented storage 103 of the raw data 101. As shown in the figure, each data entry is stored in a row-oriented representation, where the values of the same field are stored separately. Conceptually, the row oriented storage 103 can map from row identifiers, "id": "0", "id": "1", "id": "2") to the other data items included in the same row. For example, "id": "0" can be used to map to "n": 0 and "name": "a".

FIG. 1C illustrates exemplary column oriented storage 105 of the raw data 101. A column-oriented data store (such as a metrics or analytics database) would store the items in a column-oriented representation, where the values of the same field are stored together. Conceptually, the column-oriented storage 105 can map the field names to the set of field values that exist in that field, across all data items. For example, the "name" field value is stored with ["a", "b", "c"].

To illustrate the problems that arise with traditional data storage methods, e.g., row-oriented and column-oriented data storage, consider the following query where a user would like to take the average of the values associated with the "n" field. For example, to complete this query, the following expression could be executed SELECT SUM(n)/COUNT(n) FROM Table_1. This expression calculates the sum of the values in the n column, then divides that sum by the count of rows in the table.

A row-oriented data store would load and evaluate each row to answer this query. As a consequence, data is fetched from storage that is not relevant. In the example above, all three rows would be fetched from storage, each row containing the fields "id", "n", "name", and "timeout". But, only the "n" field's values would be extracted and evaluated. Accordingly, this query has a data fetch efficiency of 25%, because of the data fetched, only one of four fields were relevant to query processing.

In contrast, a column-oriented data store would be able to fetch just the values of the relevant field. But this comes at the expense of interacting with a second data structure to access the location of the values. For example, the data store would first access a metadata store that maps the field names to arrays of the values. Next, the data store would access the array of values and perform processing. Thus, according to this example, the data store would perform two internal lookup operations: (1) a read of the metadata store, which takes as input the field name "n" and returns an internal location at which to fetch the column-oriented data and (2) a read of the column store, which takes as input an internal location, and produces the values [0, 100, 200].

If accessing the metadata store has negligible overhead, then the data fetch efficiency is 100%, because the data fetched equals the data processed. However, in practice, when using traditional column-oriented data stores, a problem arises: as the complexity of the dataset increases, the complexity of the metadata structure also increases. In this example, such a problem would arise if the number of fields across all the items grew in number, which would cause the number of field names in the metadata structure to increase. As the number of fields increases, storing and accessing the metadata can introduce significant overhead into the system.

The scenarios in which the metadata structure becomes complex include any of the following: hyperdimensionality, hypercardinality, sparsity, and schemaless. As used herein, the issues of hyperdimensionality, hypercardinality, sparsity, and/or schemaless discussed the above, may be referred to as "Metadata Storage Scaling Problems".

A hyperdimensional dataset can include many (perhaps trillions or more) different fields. Each field contains one or more values that, across the dataset, can be stored in columns. The metadata structure contains metadata for each field in the dataset. For example, if the dataset is very "wide", then it may have trillions of different fields. The metadata structure can store information about each of these trillions of fields, so that queries can identify and fetch the relevant arrays of values. Storing metadata for trillions of fields may take petabytes of storage; at such a scale, sophisticated techniques may be required to manage such complex metadata.

A hypercardinal dataset can include one or more fields containing many (perhaps trillions or more) unique values across many different items. In some systems, such as search engines, the metadata store contains not just field names, but also field values. For example, the metadata store can store the columns as inverted indices that can provide lookups on term-document co-occurrences. In such an arrangement, while the number of fields may be low, the number of values are large. As a result, because all the values are incorporated into the metadata store, the metadata store is complex and difficult to manage. Thus, the cardinality problem of the data has turned into a dimensionality problem of the metadata.

A sparse dataset may include fields that do not occur in all data entries. That is, fields may be occasionally or frequently empty across different data entries. For example, consider a raw dataset including trillions of entries, each with a field name that only ever occurs once in the dataset (which would be the case when using a universally-unique identifier as a field name). In this situation, the metadata store must store information about each field, yet that field may contain an array with only one value. As a result, the metadata store is in fact larger in storage than the data store. As a consequence, the metadata store may become the bottleneck during data store and read operations, and there may be no opportunities to achieve data compression in storage, because the values are not co-located.

A schemaless dataset may include field names and types that are unknown and may change at any time. For example, consider a dataset where new field names are encountered often. Each occurrence of a new field requires a modification to the metadata store. If every item written to the data store includes a new field, then the metadata store must be modified at the same time as the column-oriented store, which adds significant overhead to the overall system.

Embodiments of the present disclosure provide systems and methods to address the metadata storage scaling problems by removing the need to maintain a metadata store altogether. In one or more examples, embodiments of the present disclosure introduces a new approach that solves problems associated with managing and searching large and complex data structures, especially in column-oriented data stores and inverted indexes, using pluggable structure-preserving dimensionality reducers and set intersection primitives, to accelerate queries on datasets that exhibit any combination of cardinality, dimensionality, sparsity, hierarchical structure, relational structure, or schemalessness.

The techniques described herein improve the functioning of a computer or computer system, for example, by increasing the throughput and lowering the latency of ingestion pipelines in databases. Embodiments according to the present disclosure achieve this by, for example, eliminating the need for an internal auxiliary datastore to manage the metadata for columns and schema information in a database.

In one or more embodiments, the functioning of a computer system can be improved by increasing the throughput and lowering the latency of indexing systems in databases. Embodiments according to the present disclosure achieve this by, for example, storing values in a flat ordered key-value, which can have excellent and predictable runtime performance.

In one or more embodiments, the functioning of a computer system can be improved by increasing the utilization of storage space in databases. Embodiments according to the present disclosure achieve this by, for example, packing metadata and data together in a unified representation, thereby eliminating the need to store internal storage identifiers to traverse multiple data structures.

In one or more embodiments, the functioning of a computer system can be improved by increasing the throughput and lowering the latency of query processing in databases. Embodiments according to the present disclosure achieve this by, for example, packing sparse data closer together in storage, and enabling the use of more scalable data structures to store both metadata and data in a unified key-value set representation.

In one or more embodiments, the functioning of a computer system can be improved by improving the flexibility of a database to ingest, store, index, and query data that has unknown or adversarial structure.

In one or more embodiments, the functioning of a computer system can be improved by improving the stability and performance of a system that can automatically ingest, store, index, and query data that has any combination of cardinality, dimensionality, sparsity, structure, or schemalessness, without human intervention.

In one or more embodiments, the functioning of a computer system can be improved by reducing the memory and storage required by a database.

In one or more embodiments, the functioning of a computer system can be improved by improving the speed and storage utilization of a database to ingest, store, index, and query data with large numbers of dimensions (billions, trillions, or more).

In one or more embodiments, the functioning of a computer system can be improved by improving the speed and storage utilization of a database to ingest, store, index, and query data with large numbers of unique values in columns (billions, trillions, or more).

In one or more embodiments, the functioning of a computer system can be improved by improving the speed and storage utilization of a database to ingest, store, index, and query data that exhibits sparsity (many missing values).

In one or more embodiments, the functioning of a computer system can be improved by improving the speed and storage utilization of a database to ingest, store, index, and query data that exhibits schemalessness, especially in scenarios where the dataset structure may be arbitrary.

In one or more embodiments, the functioning of a computer system can be improved by improving system resilience when storing, indexing, and querying data that has extremely complex structure, such as completely random data or adversarial data. For example, embodiments according to the present disclosure can be used to store all metadata and data in a simple, unified representation that is simpler than a traditional technique.

Figure 2:
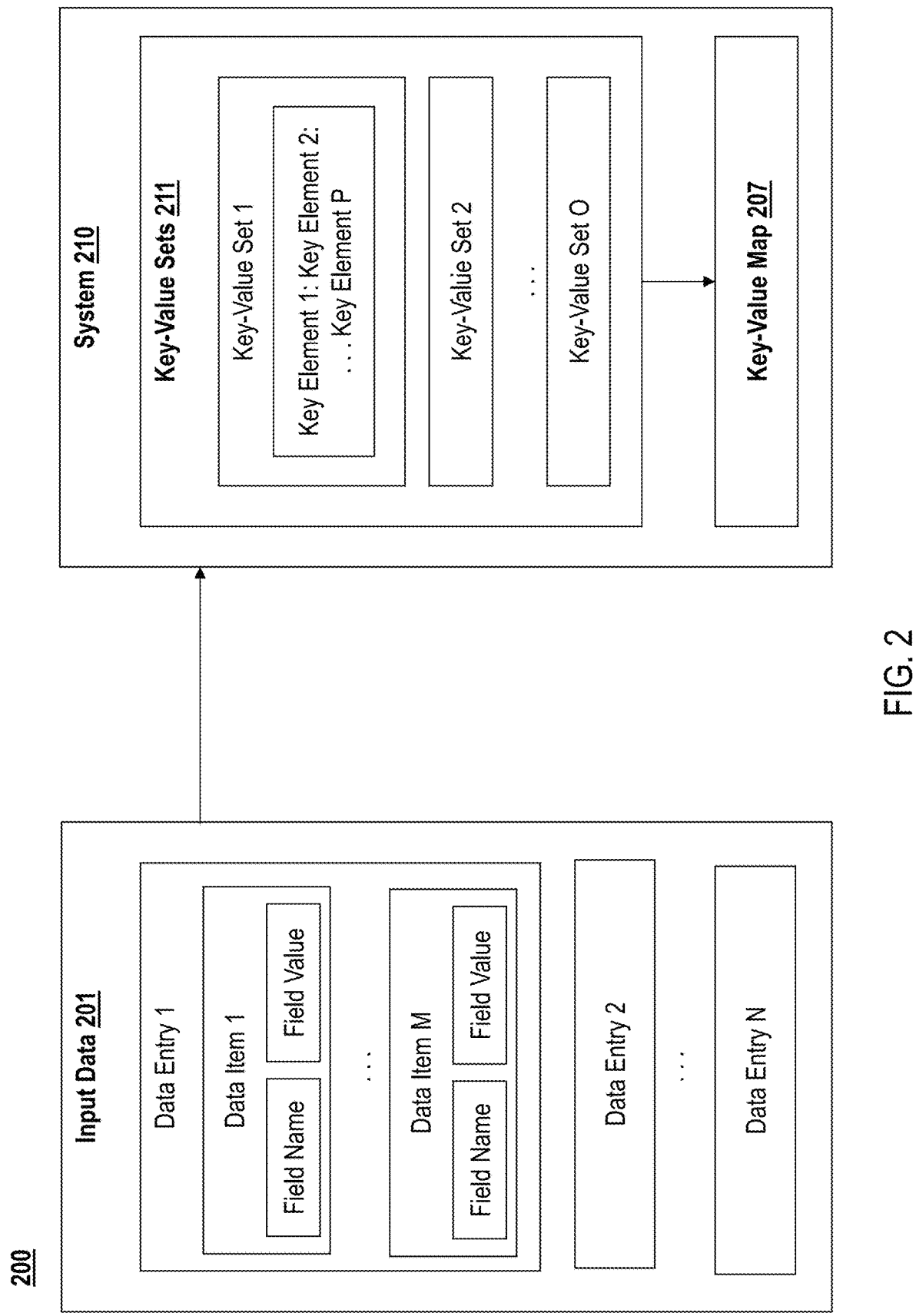
FIG. 2 illustrates an exemplary process for indexing and storing data, in accordance with some embodiments of this disclosure.

FIG. 2 illustrates exemplary process 200 for generating a key-value map according to embodiments of the present disclosure. In one or more examples, the system 210 can receive input data 201. The system 210 can generate a plurality of key-value sets 211 based on the input data 201. The system can then sort the plurality of key-value sets 211 to produce a key-value map 207. The system can then receive one or more queries to run on the key-value map 207. Based on the one or more queries, the system can retrieve one or more key-value sets responsive to the query.

As shown in the figure, the input data 201 can include one or more data entries. For example, input data 201 includes data entry 1, data entry 2, to data entry N. In one or more examples, each data entry can include one or more data items. For example, data entry 1 can include data item 1 to data item M. In one or more examples, each data item can include a field name and a field value. In one or more examples, each data item can be associated with a plurality of properties or attributes, e.g., data type. In one or more examples at least one data item in a data entry may correspond to an identifier for the data entry (e.g., an identifier to identify data entry 1). Although data entry 2 through data entry N are not shown as having individual data items, a skilled artisan will understand that each of the data entries can include one or more data items. Further, a skilled artisan will understand that the number of data entries or data items is not intended to limit the scope of the present disclosure.

The system 210 can receive the input data 201. As noted above, the system 210 can generate a plurality of key-value sets 211 based on the input data 201. As shown in the figure, each key value set can include a plurality of key elements. For example, key-value set 1 can include key element 1, key element 2, to key element P. In one or more examples, the key-value elements can be based on the field name, field value, or attributes of the data items. For example, key element 1 can be based on the field name of data item 1 and key element 2 can be based on the field value of data item 1. In one or more examples, a key element, (e.g., key element P) can be based on an attribute of the data item (e.g., data type). In one or more examples, a key element (e.g., key element P) can be based on an identifier of the data entry. In one or more examples, each of the key elements are appended to each other to generate the key-value set. The number of key-value sets and/or key elements is not intended to limit the scope of the present disclosure.

In one or more examples, the key-value set generation process can be application specific. For example, an application may wish to map data items from input data to a key-value set in a one-to-one relationship (e.g., each data item corresponds to a key-value set). As another example, each non-identifier data entry can be mapped to at least one key-value set. As another example, the system can treat arrays as "sets" that contain elements without any consideration of order. As another example, the system can treat arrays as ordered vectors that contain elements in particular positions. As another example, the system can use both representations simultaneously. Specific examples of generating key-value sets will be discussed in greater below.

Once the plurality of key-value sets are generated, the system can rank or sort the key-value sets 211 to produce a key-value map 207. As used herein, a key-value map or key-value store can refer to a plurality of ordered key-values. In one or more examples, the function that provides a comparison between keys may be a sort order for one-dimensional keys, a distance function for multi-dimensional keys, and the like. For example, one-dimensional keys can be stored in data structures like B-Trees, and multidimensional keys can be stored in a kd-tree. In one or more examples, particularly ones dealing with large and/or complex datasets, may use, but is not limited to, B-Trees or LSM Trees, to store and query the key-value sets. The specific sorting functions are not intended to limit the scope of the disclosure.

The system can run one or more queries on the key-value map 207 to identify and/or retrieve data for performing one or more database operations and/or further processing. The query can be based on one or more of a field name, field value, properties of the data, identifiers, and the like. The query can search among the keys of the key-value set to retrieve the value and/or the key-value set itself.

One of the advantages of embodiments of the present disclosure of relates to the flexibility of using various key elements in the key-value set based on the query to be executed on the key-value map. In one or more examples, the physical representation of a "key" and a "value" in the key-value set may be application-dependent. For example, a database could include a key-value set corresponding to {map:c:number:42:1}, where "c" corresponds to a field name, "42" corresponds to a field value, "map" and "number" correspond to properties (e.g., data types), and "1" corresponds to the identifier value for the data entry. In this example, the key-value set includes five key elements. In one or more examples, the key-value set can be stored in the database as a string.

Based on this example, if the system were to receive a query to identify data items in the database that include field c, then the system could run a range query (e.g., map:c:*) where the map:c portion of the key-value set would be treated as the key and the number:42:1 portion would be treated as the value. In one or more examples, the query can be understood to include query term, where the "map:c" portion of the query map:c:* is the query term. The value may be subject to a secondary part of the query processing. As another example, if the system were to receive a query to identify data items that include c values corresponding to 42, the system could run a range query (e.g., map:c:number:42:*), where the map:c:number:42 portion of the key-value set could be treated as the key, while the 1 portion could be treated as the value. In this example, map:c:number:42 would correspond to the query term. In this manner, a number of queries with different query terms can be run based on the structure of the same key-value set.

In one or more examples, the query can include set intersection logic. During query processing with set intersection logic, the temporary sets of values to intersect may be very large (depending on the results of the range lookups). In these situations, the aggregate size may be too large to fit in fast storage (such as memory), which slows down the set intersection processing. When intersecting sets of values, the behavior is analogous to a join in a relational database. Traditional techniques to handle joins in relational databases are also useful for embodiments of the present disclosure (e.g., spilling to intermediate storage, sorting key-value sets by their values, hashing the values, and the like to find the set intersection).

The following examples relate to potential applications of the key-value map 207. A skilled artisan will understand that database management techniques according to embodiments of the present disclosure is not intended to be limited by the examples discussed below.

Column-Oriented Data Stores

FIG. 3A illustrates exemplary raw data or input data 301. As shown in the figure input data 301 can correspond to input data 101. Like input data 101, input data 301 can include one or more data entries. Each data entry can include one or more data items, where each data item can further include a field name and a corresponding field value. In one or more examples, each data entry can include an identifier item (e.g., id).

FIG. 3B illustrates key-value map 307 of input data 301 according to embodiments of the present disclosure. According to embodiment of the present disclosure, the input data 301 is stored in a "flattened" (e.g., one-dimensional) form comprising a plurality of key-value pairs or key-value sets. As shown in key-value map 307, each key-value set includes one or more key element. For example, the field name of a data item and the corresponding field value can correspond to the key elements. In one or more examples, the key-value sets are sortable and can be ordered and stored according to a sorting function. For example, the key-value sets of key-value map 307 are sorted in alphabetical order. A skilled artisan will understand that the key-value sets can be sorted according to any number of implementations of a sorted set data structure known in the art and that the sorting functions are not intended to limit the scope of this disclosure.

In one or more examples, the system can evaluate queries based on the sorted key-value sets. In one or more examples, the query can be performed on any of the key elements, e.g., the field name and/or field value. As an example, the system can receive and evaluate a range query on the sorted key-value sets to determine an average of n. To evaluate the query to take an average of n (e.g., SELECT SUM(n)/COUNT(n) FROM Table_1), embodiments of the present disclosure can evaluate a query of the form n:*, where n corresponds to the query term and * is a wildcard to obtain a lazy iterator over the key-value sets that include n (e.g., [n:0, n:100, n:200]). For each key-value set in the lazy iterator, the system can extract the field value and combine the field value with a running sum and count. Table 2 illustrates an example of the extracted values, running sum, and counts. The average can then be computed by calculating 300/3 to obtain the final result 3. Accordingly, as shown in this example, embodiments of the present disclosure can evaluate a query without accessing a metadata store.

TABLE 2

| n | SUM(n) | COUNT(n) |
|---|--------|----------|
|   | 0      | 0        |
| 0 | 0      | 1        |
| 100 | 100  | 2        |
| 200 | 300  | 3        |

As illustrated by this example, the fetch efficiency is nearly 100%. That is, every fetched datum was relevant to query processing and only the negligible overhead of searching in a sorted set was required to access the key-value sets in the query range. For example, a binary search tree would require only log(number of keys) lookups to locate the results needed for the query. In one or more examples, those results would then be contiguous on disk.

In this manner, embodiments of the present disclosure provide a database that includes an ordered key-value map including a plurality of key-value set representations of the data items. The key-value sets contain the information that would traditionally be included in the metadata stores and column-oriented storage. In other words, each key-value set unifies the storage of data corresponding to the data item and metadata. In one or more examples, the key-value sets may be stored in a single data structure, e.g., such as a binary search tree, BTree, LSM Tree, or in-memory vector. In one or more examples, blocks of key-value sets in the key-based data structure can be compressed, to provide compression benefits similar to that of traditional column-oriented compression.

Accordingly, embodiments of the present disclosure simplify the implementation of a columnar data store, by removing the need to manage a separate metadata store altogether. For example, regarding the metadata storage scaling Problems, embodiments of the present disclosure address the issues of hyperdimensionality, hypercardinality, sparsity, and schemaless data that arise with a complex metadata structure.

For example, embodiments of the present disclosure address hyperdimensionality because the field names are stored with their values in a single representation so the metadata storage structures are no longer needed. For example, a database including a key-value map according to embodiments of the present disclosure can access a field's value with, e.g., a range query on the sorted key-value sets. As a result, the metadata store problems associated with hyperdimensionality are eliminated.

As another example, embodiments of the present disclosure address hypercardinality because the field values are stored with their field names in a single representation, so the metadata storage structures are no longer needed. In particular, the distinction between a field name and a field value is eliminated because both are stored together as separate key elements in the key-value set.

As another example, embodiments of the present disclosure address sparsity because the field values are stored in key-value sets that are stored co-located with other key-value sets, regardless of whether the key-value sets belong to the same field or not. As a result, the cost of accessing data items, e.g., field names and corresponding field values is reduced. For example, referring to input data 301, a traditional system would make two fetches to obtain the arrays for id and n. But embodiments of the present disclosure can obtain the arrays for id and n in one query, e.g., with the range lookup id:*..=n:*.

As another example, embodiments of the present disclosure address schemaless data because field names and types can be added, updated, or deleted without changing the dynamics of the database. For example, adding, deleting and/or updating a key-value set can be performed at the key-value set level without impacting other key-value sets included in the database. In contrast, a column-oriented store would need to allocate new contiguous arrays for values, and update the metadata store with the new field names and array storage locations.

Complex Datasets in Inverted Indexes and Tabular Data

Embodiments of the present disclosure can also address the problems associated with storing and accessing metadata for complex datasets in inverted indexes. Inverted index structures can be used to store a mapping of content (e.g., words or numbers) to the location of the content in a document or set of documents. Similar to column-oriented storage, inverted indexes encounter Metadata Storage Scaling Problems using the storage of field-values as metadata and the storage of document identifiers as arrays of values.

FIG. 4A illustrates exemplary input data 401 that can be stored using inverted index storage. As discussed above, the exemplary input data 401 can include one or more data entries. Each data entry can include one or more data items, where each data item can further include a field name and a corresponding field value. In one or more examples, each data entry can include an identifier item (e.g., id).

FIG. 4B illustrates exemplary inverted index 403 corresponding to the input data 401. As shown in the figure, the inverted index 403 provides a mapping from a field name (e.g., reading) to a field value (e.g., 99) to a document id (e.g., 10, 20). Using this structure, a system can execute queries that provide the document identifiers given various predicates (e.g., queries corresponding to a field name). For example, referring to inverted index 403, the result for the query where reading is equal to 99 and type is equal to z, (e.g., reading==99 AND type=="z") is the set of document identifiers [20].

Traditionally, inverted indexes are often stored in a column-oriented representation. FIG. 4C illustrates exemplary column storage 405 of the inverted index 403. The field names and field values can be stored in a metadata store, and the document identifiers can be stored as arrays of values. In one or more examples, an implementation can store the field name and value pairs in a BTree or finite-state transducer, and store the document identifiers in separate arrays. Note that the representation of the input data 401—as two levels (e.g., the column storage and the metadata store)—corresponds to the column-oriented data storage scenario described above. For example, each field name-value pair in the mapping is stored in the metadata store, and each array of document identifiers is stored in the data store. Thus, the data can be stored at two locations and the system has to access both locations in order to access the data.

In contrast, embodiments of the present disclosure provide advantages over the traditional data storage techniques by storing data associated with the metadata store and the column storage together in a key-value set. FIG. 4D illustrates exemplary key-value map 407 according to embodiments of the present disclosure. As shown in the figure, the key-value map includes a plurality of key-value sets. Each key-value set can include a plurality of key elements that are appended to each other. As shown in the figure, the key elements can correspond to the field name, field value, and identifier (e.g., document id).

As discussed above, inverted indexing can be mapped to a column-oriented storage scenario. Embodiments of the present disclosure provide techniques to solve problems of dimensionality, cardinality, sparsity, and schemalessness in column-oriented storage scenarios, as discussed in the previous section. Accordingly, embodiments of the present disclosure address the Metadata Storage Scaling Problems associated with storing data from an inverted index.

A skilled artisan would understand that the techniques described in this section can be used to create inverted indexes of tabular data. Further, a skilled artisan would understand that the techniques discussed with respect to inverted indexes may be applied to forward indexes, which are commonly used to store mapping from documents to words.

Search Engines

Embodiments of the present disclosure also provide solutions for solving the metadata storage scaling problems associated with search engines. Search engines can be used to query for documents that do or do not contain user-supplied tokens. Traditionally, token-document relationships are stored in a column-major matrix, which can act as an inverted index. In the column-major matrix, each column can represent a token, each row can represent a document, and the cells can correspond to booleans that indicate whether a document contains a token. While this data structure may be adequate for small numbers of tokens or documents, as the dataset complexity grows, the overhead of accessing columnar data grows, which then needs to be solved by (in effect) using another database to speed up querying the columnar metadata.

In contrast to traditional search engine inverted indexes, embodiments of the present disclosure can be used to store the aforementioned matrix using a lower-dimensional representation, thereby eliminating the auxiliary data structures needed to query columnar metadata.

For example, consider creating a search engine for a dataset where each data entry contains a timestamp field and a text field. FIG. 5A illustrates exemplary input data 501 where each data entry contains a timestamp field and a text field. In one or more examples, a search engine ingestion pipeline can preprocess the input data 501 by converting the timestamp into a numeric field (such as an integer representing the number of seconds since the start of the UNIX epoch), and tokenizing the text field into a set of case-insensitive n-grams (e.g., a grouping of n consecutive units including letters, spaces, symbols, etc.). The scope of this disclosure is not intended to be limited by the type or pre-processing.

FIG. 5B illustrates processed data 511. As shown in the figure, the processed data 511 includes data entries where the date has been converted into a number and the text has been converted into a set of case-insensitive trigrams.

FIG. 5C illustrates exemplary unsorted key-value sets based on processed data 511, according to embodiments of the present disclosure. As shown in the figure, the key-value sets can include a plurality of key elements corresponding to the field name, field value, and data entry identifier (e.g., document identifier). In one or more examples, the key-value sets can be a sortable bytestrings, where the key-value set includes key elements corresponding to the field name and the field value of non-identifier data items as well as the corresponding identifier value (e.g., document id) for the data entry (e.g., document). FIG. 5D illustrates exemplary key-value map 507 based on the unsorted keys 509.

In one or more examples, a query can be executed to identify one or more documents that contain specified predicates. For example, the system can receive a query to identify documents that contain the trigram "fox" but not the trigram "red". Based on this query, the system can perform a first search for key-value sets having a key element equal to the text "fox" (e.g., with a query term text:"fox"). This query can identify the following key-value sets: {text: "fox":0} and {text:"fox":1}. The system can further perform a second search for key-value sets having a key element equal to the text "red" (e.g., with a query term text:"red"). This query can identify the following key-value set {text: "red":1}. The system can then remove the results of the second search from the results of the first search, which provides the following key-value set {text:"fox":0}. The identifier value, 0, can then be extracted from the key-value set and the corresponding document can be fetched from storage.

The preceding example demonstrates how any number of tokens can be flattened into one key space. Because the resulting dataset of key-value sets can be stored in a one-dimensional data store, embodiments of the present disclosure may eliminate the need for any auxiliary data structures to facilitate set intersection queries in search engines.

As discussed above, because embodiments of the present disclosure unify the representation of both the document identifier (e.g., identifier values) and column names (e.g., non-identifier field names such as text or timestamp), the problems of cardinality, dimensionality, and sparsity are solved. Additionally, embodiments of the present disclosure solve the inverted indexing problem for items that do not have a known structure (i.e. schemaless), because the transformation from data entry to key-value set is syntactic in nature. In one or more examples, the transformation from data entry to key-value set can be applied, but is not limited, to any JSON document.

In one or more examples, embodiments of the present disclosure address database issues associated with sparsity that can arise with search engines. For example, by flattening column names (e.g., field names) into the same keyspace as values, and document identifiers, embodiments of the present disclosure eliminates the need to store metadata providing lookups into sparse dimensions. This benefit becomes increasingly important in the modern era of complex datasets that may contain trillions of sparse dimensions.

Analytics Databases

Embodiments of the present disclosure can also improve the management of data associated with analytics databases.

FIG. 6A illustrates exemplary input data 601 for an analytics database. As shown in the figure, the input data 601 includes a plurality of data entries (e.g., 0, 1, 2), where each data entry includes one or more data items (e.g., id, environment, timestamp, a, b, and c).

FIG. 6B illustrates exemplary unsorted key-value sets according to embodiments of the present disclosure. As shown in the figure, the key-value sets can include a plurality of key elements including a field name, a field value, and a data entry identifier value. In one or more examples, the key-value sets can be sortable bytestrings. FIG. 6C illustrates an exemplary sorted key-value map 607 based on the unsorted key-value sets 609. As shown in the figure, the numeric key elements can be ordered according to their numeric value.

In one or more examples, the system can receive a query to identify one or more data entries. For example, the query may be used to identify data entries having an "a" field with a value greater than 0.01, and an "environment" field with a value of "production". The system can accordingly, search for key-value sets having a key greater than or equal to a:0.01, which provides the following key-value sets: {a:0.1: 0}, {a:0.3:1}. The system can additionally search for key-value sets having a key equal to environment:production, which provides the following key-value sets: {environment: production:1}, {environment:production:2}. The system can then extract the values from each of the key-value sets, which provides the following sets of values: {0, 1} for the first search and {1, 2} for the second search. Because the query relates to data entries that include both search terms, the system can intersect the values from each of the sets of values, giving: {1}. The system can then fetch the corresponding data entry from auxiliary storage. In one or more examples, the system can then perform one or more database operations on the fetched data entry.

Schemaless Data, Including Hierarchical and Relational Data

Embodiments of the present disclosure can further be used to manage schemaless data, including hierarchical and relational data. Traditionally, items with an unknown structure can be organized as an inverted index. This can include data with arbitrary combinations of cardinality, dimensionality, hierarchical structure, relational structure, sparsity, or schemalessness. According to systems and methods of the present disclosure, such schemaless data can be mapped to a data structure comprising a plurality of key-value sets.

In one or more examples, embodiments of the present disclosure can receive a plurality of arbitrary documents (e.g., JSON documents) and generate a plurality of key-value sets based on the hierarchical structure included in the documents.

FIG. 7A illustrates exemplary input data 701 comprising a plurality of inverted indexed data entries corresponding to documents (e.g., 0, 1, 2, 4). The data entries can include various properties associated with the document (e.g., a, b, c, d, abc). As seen in the figures, the input data is schemaless—there is no consistent structure between the different data entries. Note also that the exemplary input data (e.g., JSON documents) are sparse, i.e., not all documents contain values for all columns.

FIG. 7B illustrates a plurality of unsorted key-value sets corresponding to inverted index 703. As shown in the figure, the key-value sets can be generated based on the properties of the documents and the corresponding values. In one or more examples, considering the inverted index 703 as a data tree, each key-value set can be determined by walking through the path for the data item with the lowest rank. For example, as seen in the input data 701, data item "b": "foo" is nested within "a" in document 0. As shown in the figure, this data item can be extracted as {map:a:map:b:string:foo: 0}. FIG. 7C illustrates exemplary key-value map based on the plurality of unsorted key-value sets 709.

The key-value sets 709 can address two issues associated schemaless data: 1) maintaining the hierarchical structure of the input data and 2) identifying different types of data within the input data. Regarding the hierarchical structure, as shown in the figure, the hierarchical structure can be inlined into the key-value sets such that information closer to the root of the document is stored closer to the left of the key. For example, in the first document, "b": "foo" is nested within "a." This structure is reflected in the key-value set by having "a" located to the left of "b:foo" (e.g., {map:a:map: b:string:foo}). Additionally, a key-value set can identify the different types of data with the appropriate key element (e.g., map, string, array, number, etc.).

Embodiments of the present disclosure can be used to not only query values, but also information that would typically be stored as columnar metadata. In one or more examples, embodiments of the present disclosure can perform a query to find documents that have a field values a:b containing a value of type string. For example the system can search for key-value sets with key elements that include "a:map:b: string", this provides the following key-value sets: {map:a: map:b:string:bar:1}, {map:a:map:b:string:foo:0}. The system can then extract the values from each of the key-value sets, which provides {0, 1}. The documents corresponding to 0 and 1 can then be fetched from storage and the desired database operations can be performed on the data.

Accordingly, embodiments of the present disclosure can be used to query for arbitrary structure in scare and schemaless input data. In this manner, embodiments of the preset disclosure can generate a sorted key-value map for any syntactically-valid input data, regardless of cardinality, dimensionality, sparsity, schemalessness, or hierarchical structure.

Further, embodiments of the present disclosure provide benefits for reducing the amount storage space used to store the data and associated data structure. In a traditional system, when datasets exhibit sparsity, high-dimensionality, or high-cardinality, the overhead of metadata storage space usage can be significant. Embodiments of the present disclosure overcome this problem by relying on a low-dimensional data-structure comprising a plurality of key-value sets.

For example, traditional data storage architectures typically include two storage systems (e.g., metadata store and data store). FIG. 8A illustrates the metadata store 813 that contains the keys to be queried (e.g., bar, baz, foo), mapped to internal storage identifiers (e.g., 1234, 5678, 9012). The internal storage identifiers can point to the list of values for each key. FIG. 8B illustrates the data store 801 that includes the set of internal storage identifiers, mapped to the lists of values (e.g., [1], [100], [10000]). As shown in the figures, each key, is mapped to a single value. For example, each key points to a different internal storage identifier in the set {1234, 5678, 9012}, and each identifier points to a different list with the value.

The crux of the problem with traditional systems is that the space needed to store the internal identifiers can be as large, or larger than, the sets of values themselves. In the above example, consider the situation wherein each key is 64 bits in size, each internal identifier is 64 bits in size, and each value is also 64 bits in size. Accordingly, the storage of the identifiers is as much as the storage of the values.

Embodiments in accordance with the present disclosure, however can reduce, the storage requirements. FIG. 8C illustrates key-value map 807 according to embodiments of the present disclosure. As shown the key-value map 807 provides a data storage structure that eliminates the need for metadata storage—such as internal storage identifiers—thereby using much less space. Additionally, embodiments of the present disclosure enable data from different columns (e.g., corresponding to different filed names) to be co-located on disk, thereby leading to improved spatial locality and thereby improved compression rations.

Accordingly, embodiments of the present disclosure unifies inverted indexing for various data types, whether these data types exhibit hyper-dimensionality, hyper-cardinality, sparsity, hierarchical structure, relational structure, true schemalessness, or any combination thereof. Because embodiments of the present disclosure can be used to lower the dimensionality of the data, low-dimensional data structures (such as binary search trees) can be used to build a database for data with many dimensions. Conceptually, embodiments according to the present disclosure "flatten" the structure of items into a unified representation amenable to a unified lookup method.

Further, embodiments of the present disclosure address database issues associated with adversarial or random data. For example, embodiments of the present disclosure enable storage, indexing, and querying of arbitrary schemaless data, without configuration from a third-party (human or computer). In one or more examples, management of the sorted key-value data structure can be performed by a computer administrator or automatically. Therefore, embodiments of the present disclosure enable the ingestion, indexing, and serving of data that may be considered adversarial: arbitrarily large numbers of columns (hyper-dimensionality), arbitrary large numbers of values (hyper-cardinality), extreme sparsity (such as when a column and/or value only appears once in dataset), and inconsistent structure (schemalessness). In contrast, traditional systems quickly run into performance and stability problems when data is adversarial or random.

Further, embodiments of the present disclosure provide benefits for ingestion pipelines. For example, embodiments of the present disclosure simplify the management of data that exhibit high-cardinality, high-dimensionality, and schemalessness. According to embodiments of the present disclosure, such data may be ingested, indexed, and queried using a single ordered key-value data structure, such as a B-Tree. single ordered key-value data structure are operationally simple compared to other implementations that require the use of two data stores, e.g., one to manage metadata, and another to manage data (such as a Finite State Transducer for metadata, and columnar storage for the data). In this manner the key-value set data representation facilitates the use of simple and efficient data structures.

For example, to add a document to an inverted index using a traditional approach would require updating both the metadata and data stores. In contrast, according to embodiments of the present disclosure, only one storage system, e.g., the key-value set data structure, will be updated.

As another example, according to embodiments of the present disclosure, the ingestion process for a new data item, whether the new data item corresponds to a new field name or not, is the same. For example, new key-value set can be generated based on the new data item, and the new key-value set can be inserted into the ordered key-value map. In contrast, traditional methods require the system to update the metadata store with information about the column, as well as storing the new data.

In one or more examples, embodiments of the present disclosure can be used in a streaming fashion, by interleaving the process of updating items in the inverted index with the evaluation of queries.

In one or more examples, modifying key-value sets corresponding to an updated data item (e.g., updating key elements in the key-value set) can be accomplished by physical deletion or logical deletion. In one or more examples, the query terms generated from data entries may be trivial, such as when the queries are based on the identifier value of the data entry.

In one or more examples, the key elements generated from data entries and/or data items may be random, such as UUIDs, when the goal is to spread key-value sets evenly in a keyspace. In some embodiments, such randomization of the key-value sets may be useful for load-balancing in a distributed database.

In the key-value sets, the key elements may contain arbitrary inline data. In one or more examples, the system can store the identifier value of the data entry in a key element. In other examples, the system can store information such as the term frequency (used in BM25 relevancy ranking applications) or other data in the key elements (e.g., "fast fields").

In one or more examples the key-value sets (e.g., including the key elements) can be compressed using lossless or lossy techniques. In one or more examples, lossy approach could drop key-value sets during processing, to save space at the cost of introducing lookup errors.

In one or more examples, multiple key-value sets may be generated from a single value in a data item. For example, the system can support so-called "duck typing" by writing multiple equivalent key-values sets that contain different type signatures. For example, given the data entry {"id": 0, "a": true}, at least two key-value sets could be generated: {a:boolean:true:0} and {a:integer:1:0}. In one or more examples, to access the data item stored in a key-value map, a user may supply a query on either a boolean or an integer and retrieve the same results.

Figure 9A:
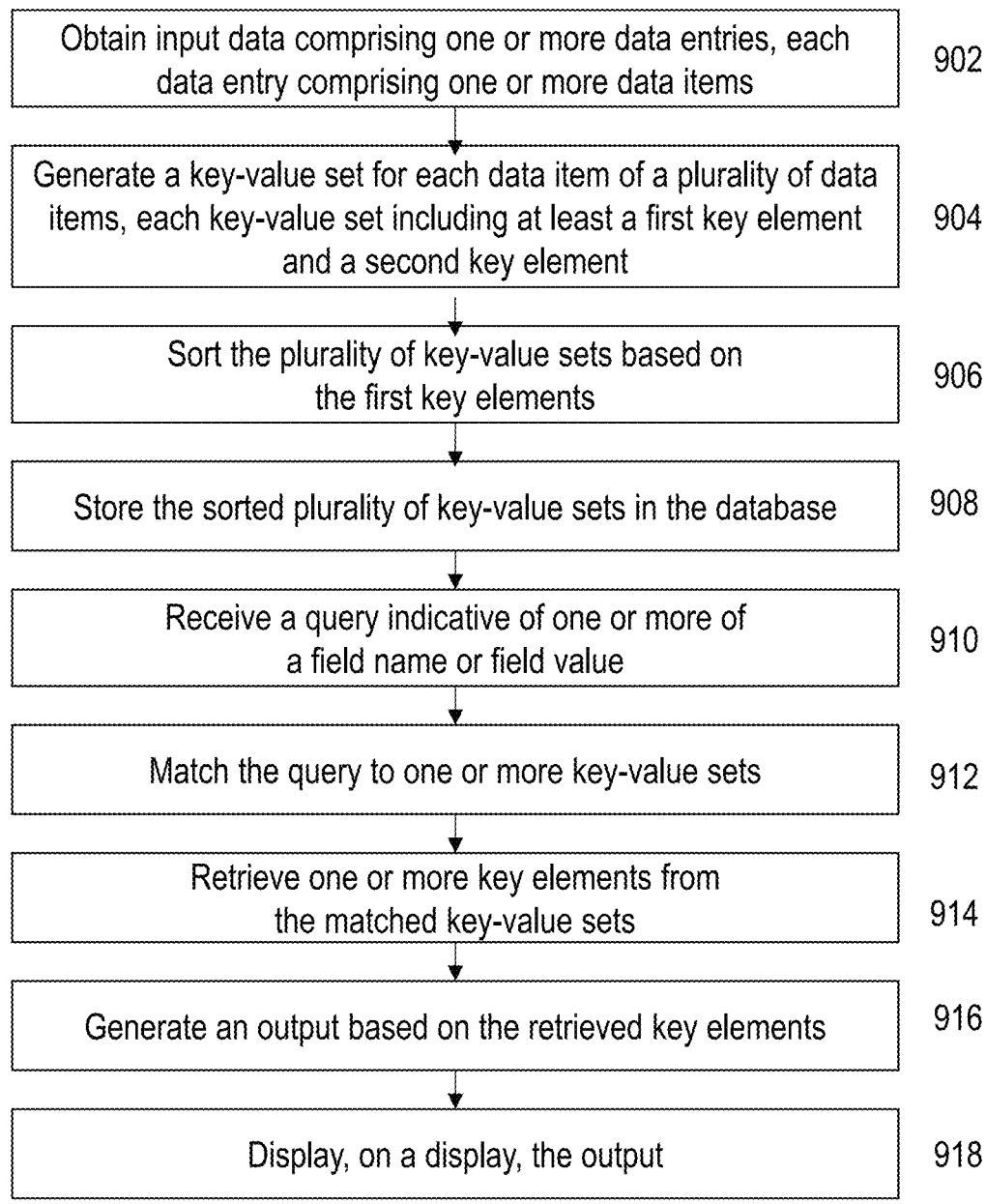
FIGS. 9A-9D illustrate exemplary processes for managing a database, in accordance with some embodiments of this disclosure.

FIG. 9A illustrates a flow chart of a process 900 for managing a database and/or providing data retrieval, according to embodiments of the present disclosure. The following description of process 900 will be described with reference to FIGS. 5A-5D to further clarify the process. Process 900 is performed, for example, using one or more electronic devices implementing a software platform. In some examples, process 900 is performed using a client-server system, and the blocks of process 900 are divided up in any manner between the server and a client device. In other examples, the blocks of process 900 are divided up between the server and multiple client devices. In other examples, process 900 is performed using only a client device or only multiple client devices. In process 900, some blocks are, optionally, combined, the order of some blocks is, optionally, changed, and some blocks are, optionally, omitted. In some examples, additional steps may be performed in combination with the process 900. Accordingly, the operations as illustrated (and described in greater detail below) are exemplary by nature and, as such, should not be viewed as limiting.

At Block 902, the system can obtain input data including one or more data entries. For example, the system can obtain input data 501. As described above, each data entry can include one or more data items, which can include at least a field name, field value, and properties associated with the data items. In one or more examples, the input data 501 can be pre-processed to produce processed data 511.

At Block 904, the system can generate a key-value set for each data item of a plurality of data items. For example, a plurality of unsorted key-value sets 509 can be generated based on the input data 501. As described above, each key-value set can include a plurality of key elements. For example, the key value set can include at least a first key element and a second key element. For example, key-value set {timestamp:1546329600:0} can correspond to the timestamp data item from document 0, where the timestamp key element corresponds to the timestamp field, the 1546329600 key element corresponds to the corresponding value, and the 0 key element corresponds to the document identifier. In one or more examples, the first key element can correspond to the key element located farthest to the left in the key-value set.

At Block 906, the system can sort the key-value sets based on key elements. For example, as shown in key-value map 507, the plurality of key-value sets are sorted based on the first key element. Key value sets that share the same first key element can then sorted by the second key element, and so on. At Block 908, the system can store the sorted key-value sets in the database.

At Block 910, the system can receive a query indicative of one or more of a field name or a field value. For example, as described above, the system can receive a query to search for documents that include the text "fox". In one or more examples, the system can generate a query term to perform a search on the key-value map. In this example, the query term could correspond to text: "fox". At Block 912, the system can match one or more response key-value sets to the field name or field value indicated in the query. For example, the query for documents that include the text "fox" would provide the following key-value sets: {text: "fox":0} and {text: "fox":1}. At Block 914, the system can retrieve the matched key-value sets and/or the data entry corresponding to the matched key-value sets. In one or more examples, the system can retrieve one or more key elements from the matched key-value sets. For example, the system can retrieve values 0 and 1. At Block 916, the system can generate an output based on the matched key-value sets. For example, the system can retrieve the documents corresponding to document identifier values 0 and 1 as the output. In one or more examples, the system can use the values in the matched key-value sets in an application specific manner to perform one or more database operations. In one or more examples, database operations can include, but not be limited to, creating data, accessing data, moving data, deleting data, and the like. In one or more examples, database operations can further include, but not be limited to, one or more operators such as select, project, join, product, union, intersect, difference, and divide. At Block 918, the system can display the output. For example, the system can display the documents corresponding to values 0 and 1.

Figure 9B:
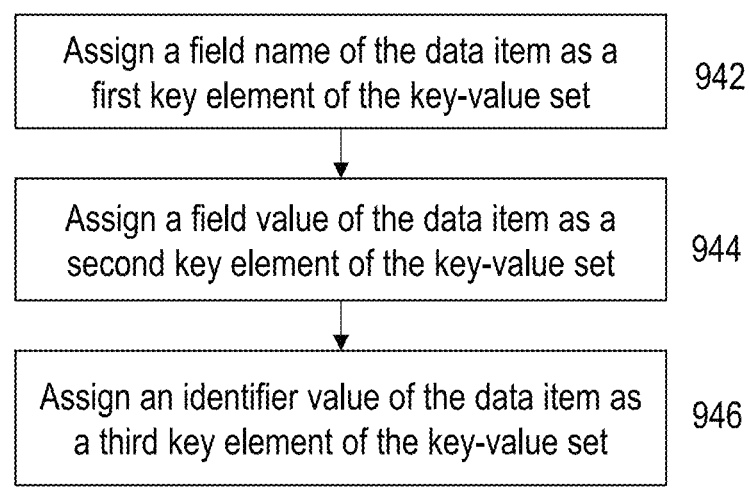

FIG. 9B illustrates a flow chart of a process 904B for obtaining a key-value set for a data item, according to embodiments of the present disclosure. The following description of process 904B will be described with reference to FIGS. 5A-5D to further clarify the process. Process 904B is performed, for example, using one or more electronic devices implementing a software platform. In some examples, process 904B is performed using a client-server system, and the blocks of process 904B are divided up in any manner between the server and a client device. In other examples, the blocks of process 904B are divided up between the server and multiple client devices. In other examples, process 904B is performed using only a client device or only multiple client devices. In process 904B, some blocks are, optionally, combined, the order of some blocks is, optionally, changed, and some blocks are, optionally, omitted. In some examples, additional steps may be performed in combination with the process 904B. Accordingly, the operations as illustrated (and described in greater detail below) are exemplary by nature and, as such, should not be viewed as limiting.

At Block 942, the system can assign a field name of the data item as a first key element of the key-value set. For example, based on the data item "text": "qui" of data entry 0, the system can extract "text" as the first key element. At Block 944, the system can assign a field value of the data item as a second key element of the key-value set. For example, based on the data item "text": "qui" of data entry 0, the system can extract "qui" as the second key element. At Block 946, the system can assign an identifier value of data item as a third key element of the key-value set. For example, based on the identifier item of "id":0, the system can extract 0 as the third key element. Using these key elements, the system can generate a key-value set {"text": "qui":0}. In one or more examples, the key elements can be appended to each other to generate the key-value sets.

In one or more examples, the system can analyze the input data to determine a schema or format for the key-value set. For example, in some embodiments, the system can analyze the input data to determine a schema to generate a key-value set. In one or more examples, the system can analyze the input data (e.g., input data 301) and determine that there should be a one-to-one mapping of data items to key-value sets. For example, as shown in key-value map 307, there is a one-to-one mapping of data items in input data 301 to key-value sets. In one or more examples, this determination may be based on the types of data included in the data items and/or the structure of the data entry.

In one or more examples, the system can analyze the input data, (e.g., input data 401) and determine that there should be a many-to-one mapping of data items to a key-value set. For example, as shown in key-value map 407, there is a many-to-one mapping of data items to a key-value set (e.g., each key value set includes terms from multiple data items). In one or more examples, this determination may be based on the types of data included in the data items and/or the structure of the data entry. For example, the system can identify that the input data includes an identifier and determine that the identifier should be associated with the non-identifier data items. As another example, the system can determine that the input data can be organized as an inverted index and determine the key-value set schema based on this structure.

In one or more embodiments, the system can receive a user input to indicate the schema to generate a key-value set. In such examples, the user input can indicate whether the key-value map should include a one-to-one or may-to-one mapping of data items to a respective key-value set.

Figure 9C:
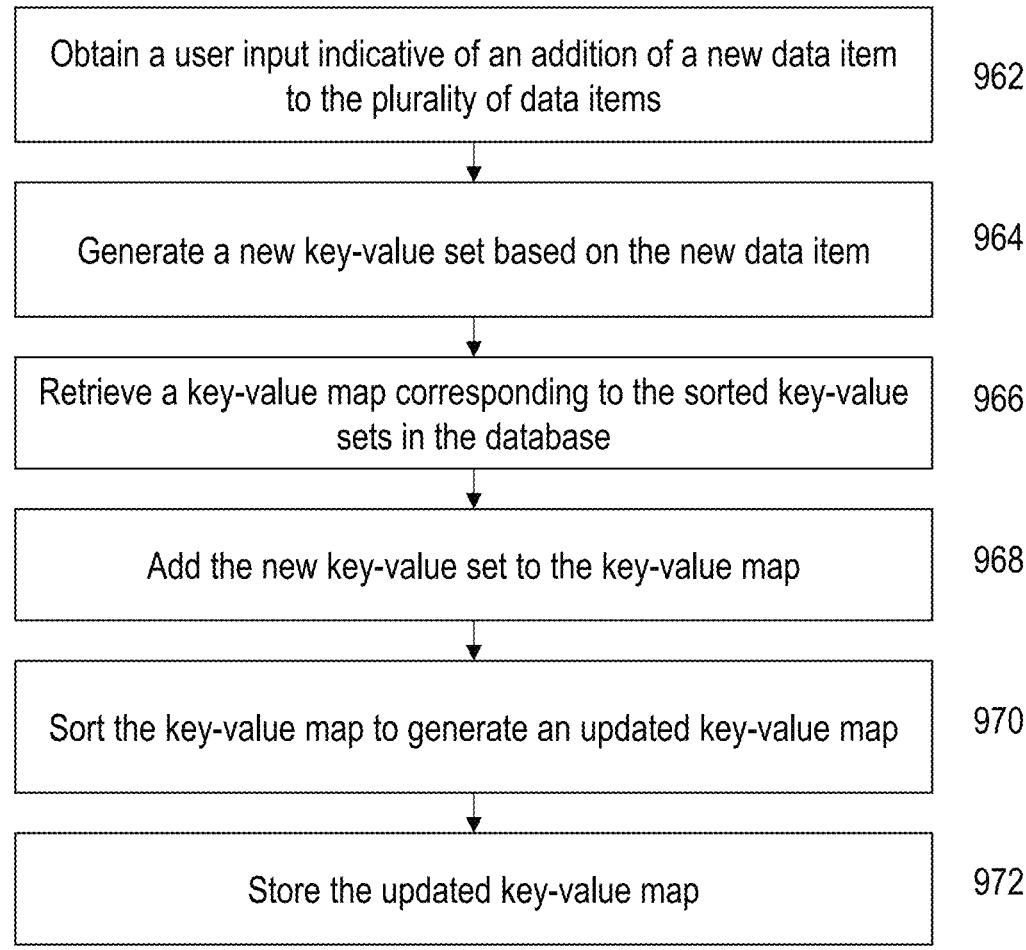

FIG. 9C illustrates a flow chart of a process 960 for adding a new data item to an existing key-value map, according to embodiments of the present disclosure. The following description of process 960 will be described with reference to FIGS. 4A-4D to further clarify the process. Process 960 is performed, for example, using one or more electronic devices implementing a software platform. In some examples, process 960 is performed using a client-server system, and the blocks of process 960 are divided up in any manner between the server and a client device. In other examples, the blocks of process 960 are divided up between the server and multiple client devices. In other examples, process 960 is performed using only a client device or only multiple client devices. In process 960, some blocks are, optionally, combined, the order of some blocks is, optionally, changed, and some blocks are, optionally, omitted. In some examples, additional steps may be performed in combination with the process 960. Accordingly, the operations as illustrated (and described in greater detail below) are exemplary by nature and, as such, should not be viewed as limiting.

At Block 962, the system can obtain a user input indicative of an addition of a new data item to the plurality of data items. For example, referring to input data 401, the data entry corresponding to "id": "10" could be updated to include a new data item "delay": 2. At Block 964, the system can generate a new key-value set based on the new data item. For example, the system can generate a new key-value set {delay: 2:10}. At Block 966, the system can retrieve a key-value map that includes the sorted plurality of key-value sets stored in the database generated in process 900. For example, key-value map 407 can be retrieved. At Block 968, the system can add the new key-value set to the key-value map. At Block 970, the system can sort the key-value map to generate an updated key-value map. For example, the new key-value set, would added to the key-value map 407 and sorted to be the first entry in the key-value map, before {delay:3:20}. At Block 972, the system can store the updated key-value map. While this is described with respect to a single data item, this process could also apply to multiple data items as well as new data entries.

Figure 9D:
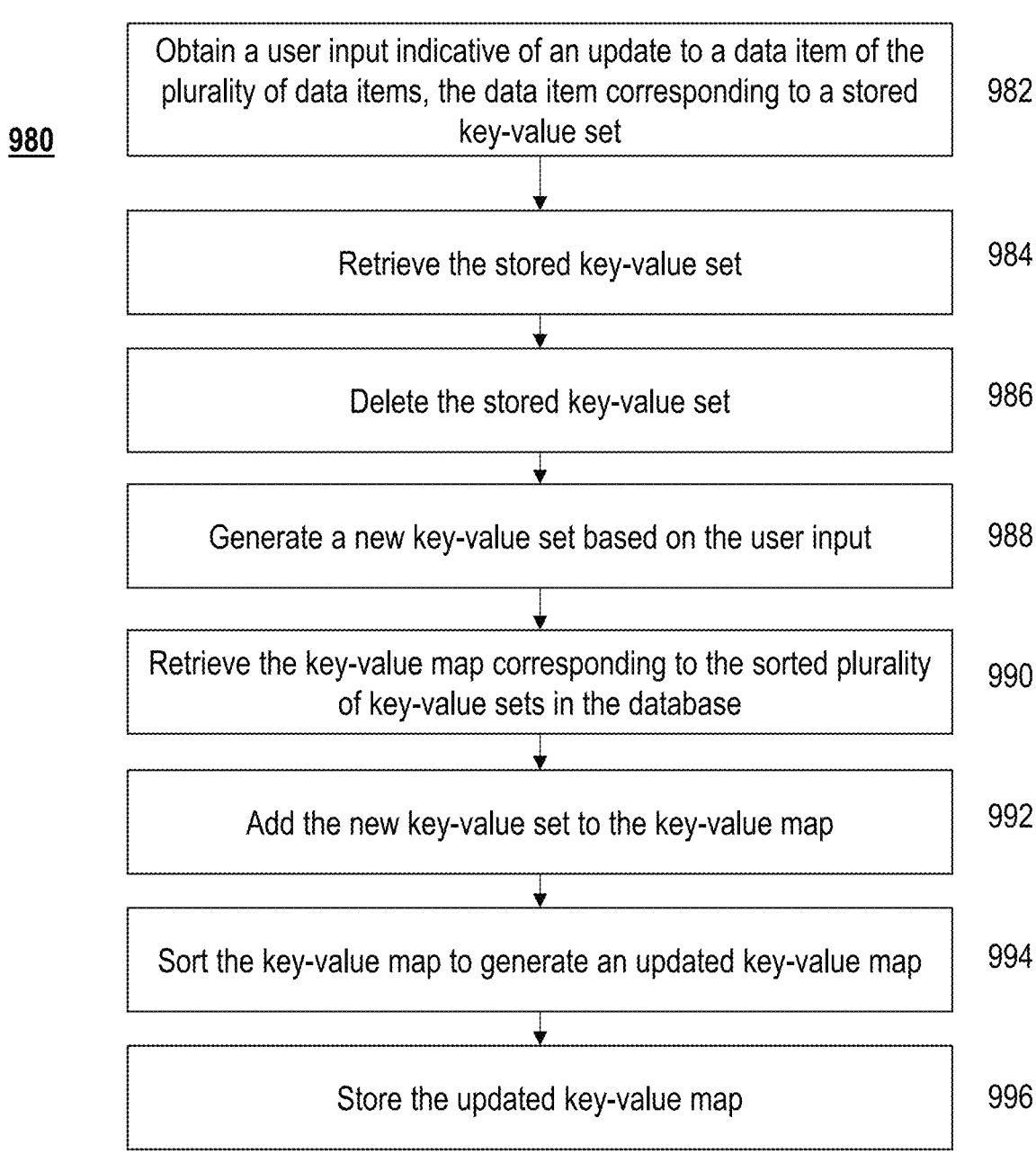

FIG. 9D illustrates a flow chart of a process 980 for updating a data item in an existing key-value map, according to embodiments of the present disclosure. The following description of process 980 will be described with reference to FIGS. 4A-4D to further clarify the process. Process 980 is performed, for example, using one or more electronic devices implementing a software platform. In some examples, process 980 is performed using a client-server system, and the blocks of process 980 are divided up in any manner between the server and a client device. In other examples, the blocks of process 980 are divided up between the server and multiple client devices. In other examples, process 980 is performed using only a client device or only multiple client devices. In process 980, some blocks are, optionally, combined, the order of some blocks is, optionally, changed, and some blocks are, optionally, omitted. In some examples, additional steps may be performed in combination with the process 980. Accordingly, the operations as illustrated (and described in greater detail below) are exemplary by nature and, as such, should not be viewed as limiting.

At Block 982, the system can obtain a user input indicative of an update to a data item of a plurality of data items, where the data item corresponds to a stored key-value set. For example, referring to key-value map 409, the updated data input data may correspond to a change in the value associated with the delay field from 3 to 2 for data item 1. In this example, the stored key-value set could correspond to {delay: 3:10}. At Block 984, the system can retrieve the stored key-value set. For example, the system could retrieve {delay: 3:10}. At Block 986, the system can delete the stored key-value set. For example, the system could delete {delay: 3:10}.

At Block 988, the system can generate a key-value set based on the user input. For example, the system can generate a new key-value set {delay: 2:10}. At Block 990, the system can retrieve a key-value map that corresponding to the sorted plurality of key-value sets stored in the database generated in process 900. For example, key-value map 407 can be retrieved. At Block 992, the system can add the new key-value set to the key-value map. At Block 994, the system can sort the key-value map to generate an updated key-value map. For example, the new key-value set, would be sorted to be the first entry in the key-value map. At Block 996, the system can store the updated key-value map. While this is described with respect to a single data item, this process could also apply to multiple updated data items.

Superindexing Systems and Methods

Embodiments of the present disclosure are directed to systems and methods for using a predictive system to enhance database operations, such as, but not limited to write or storage operations. Embodiments of the present disclosure introduce a new approach that solves problems associated with managing and searching large and complex data structures, particularly with respect to storing data within the database. For example, embodiments of the present disclosure can use a statistical model to enhance database operations such as write and read operations. For example, the machine learning model can be used to determine optimal locations in storage to write data to and/or access data when receiving read and write requests from a client. Methods according to embodiments of this disclosure may be used to accomplish some or all the following objectives.

In one or more examples, methods disclosed herein improve traditional data structures used in databases by using a statistical model to augment or replace traditional data structures, and/or generate customized and optimized versions of those data structures from scratch for each dataset encountered in the database.

Embodiments disclosed herein incorporate the use of machine learning and deep learning to improve performance, increase efficiency, and automate manual system management of databases. For example, using a deep learning model that takes as input observations of database operations and their outcomes (such as observing query patterns, disk latencies, and so on), and outputting data migration command (such as a command to "move value X from storage location A to memory location B"). The system can implement the data migration command to improve the data storage within the database and improve efficiencies associated with accessing the data at a later time.

The techniques described herein improve the functioning of a computer or computer system, for example, by reducing storage space used, in a storage system that uses block compression. Embodiments according to the present disclosure achieve this by storing similar items in the same blocks in storage. Storing similar objects together improves compression ratios at the block level in storage, because compression algorithms benefit when the data being compressed is similar.

In one or more embodiments, the functioning of a computer system can be improved by reducing query latency. Embodiments according to the present disclosure achieve this by using a statistical model to store objects closer together in storage if the objects are likely to co-occur in query responses. This results in fewer fetches from storage during query processing. For example, the statistical model can identify a location in storage and/or structure the database to store data that will likely co-occur in a query together.

In one or more embodiments, the functioning of a computer system can be improved by reducing write latency. Embodiments according to the present disclosure achieve this by using a statistical model to store objects closer to their final destination in storage, thereby avoiding computationally expensive compaction operations.

In one or more embodiments, the functioning of a computer system can be improved by automatically creating databases indexes. Embodiments according to the present disclosure achieve this by using the model to choose indexing data structures. This simplifies the end-user experience, for example, by reducing the amount of manual database management performed by the end user.

In one or more embodiments, the functioning of a computer system can be improved by improving cache efficiency. Embodiments according to the present disclosure achieve this by pro-actively caching objects that are predicted to be queried during similar scenarios.

In one or more embodiments, the functioning of a computer system can be improved by providing bespoke database indexing that is adapted to identify optimal storage locations for a database based on data objects to be stored in the database and/or the existing indexing database structure. Embodiments according to the present disclosure achieve this by using the statistical model to determine the index. For example, by using a statistical model derived from samples of database objects, the distribution of objects in storage can be improved, such as by eliminating hot or cold spots in storage. Systems and methods in accordance with this disclosure thereby improve the user experience by providing indexes for a dataset to be stored in a database, e.g., so the end-user does not need to create these indexes.

In one or more embodiments, the functioning of a computer system can be improved by solving database problems involving high-dimensional data, in which the sheer number of columns (also known as "fields", "dimensions", "types", etc.) degrades performance of traditional database operations. Embodiments according to the present disclosure achieve this by clustering columns based on similarity metrics, such as whether the columns are likely to co-occur in documents. The columns may be stored together and grouped by a cluster identifier, such that queries for sets of keywords included in the cluster will result in a fewer number of disk searches. In some embodiments, database operations may be improved by using combinatorial optimization.

In one or more embodiments, the functioning of a computer system can be improved by solving database problems involving high-cardinality data, in which the number of distinct values in a dataset is extremely high. Embodiments according to the present disclosure achieve this by transforming high-cardinality data into an equivalent high-dimensional dataset and handling as described above. For example, the high-cardinality data can be processed into a matrix such that each distinct value in the original dataset corresponds to a column in the matrix and each row stores the co-occurring values.

In one or more embodiments, the functioning of a computer system can be improved by optimizing data layout on disk to achieve improvements in storage efficiency, with an emphasis on improving query efficiency. This can be achieved by configuring the database so "data that fires together, wires together." That is, if a query selects more than one item, then those items can be placed closer together in storage to improve access latencies.

In one or more embodiments, the functioning of a computer system can be improved by improving performance for different concurrent clients. Embodiments according to the present disclosure achieve this by using a statistical model to determine different access patterns and datasets in use by different clients. In this way, methods disclosed herein can be used to "personalize" a database system for different users.

In one or more embodiments, the functioning of a computer system can be improved by efficiently handling requests on data that lacks a schema. As used herein, the term "zero schema" capability may be used to describe data that lacks a schema. In traditional systems, users either explicitly specify schemas for their data (e.g., SQL databases such as MySQL), or users ensure that their data complies with an implicit schema so that the database can infer the schema (e.g., NoSQL databases such as Elasticsearch). In both cases, users ensure that the data being written to the database complies with a schema, regardless of whether the schema is explicit or implicit. However, according to methods of the present disclosure, users do not need to specify a schema. According to one or more embodiments, schemaless data can be treated as a large sparse matrix, where every unique value is a column, and every object is a row. In one or more examples, this may include flattening the data into a key-value set and indexing the data accordingly, as described above in the Database Indexing section.

In one or more embodiments, the functioning of a computer system can be improved by automatically generating balanced groups of data, to improve access speeds, reduce hot and cold spots during database operations, and reduce wear-and-tear on physical equipment. This can be achieved using methods of the present disclosure to estimate the density of the dataset with a statistical model, and use the density estimator to create and maintain balanced partitions of data through ongoing rebalancing operations. For example, the model determine how to rebalance partitions.

For any modeling process that identifies structure in a dataset, embodiments of the present disclosure can improve the functioning of a computer system by leveraging this structure to optimize storage layout. Methods according to embodiments of this disclosure achieve this by writing the model-derived structure to storage and using the resulting data structures during querying. In this way, outputs of the statistical model can be utilized to improve database operations, such as, but not limited to read and write operations.

Accordingly, methods disclosed herein improve traditional data structures used in databases, because the model output is used to augment or replace traditional data structures, and/or generate customized and optimized versions of those data structures from scratch for each dataset encountered in the database. These methods incorporate machine learning and deep learning to improve performance, increase efficiency, and automate away manual database system management. For example, embodiments of the present disclosure can use a deep learning model that takes as input observations of database operations and respective outcomes (such as observing query patterns, disk latencies, and so on), and outputting data migration commands (such as a command to "move value X from storage location A to memory location B"). The system can then implement the data migration commands to realize improved performance and increased efficiencies. In some examples, embodiments of the present disclosure can determine optimized storage locations for new data to be written to the database. Methods disclosed herein treat the databases—including storage, access, background operations—as an end-to-end optimizable system, and as differentiable systems.

In one or more examples, methods disclosed herein may use hardware or software to accelerate model training and prediction. For example, embodiments of the present disclosure can utilize AI accelerators (such as Graphics Processing Units, Tensor Processing Units (TPUs), FPGA, ASICs, etc.) directly into the core of a database's operation.

Figure 10:
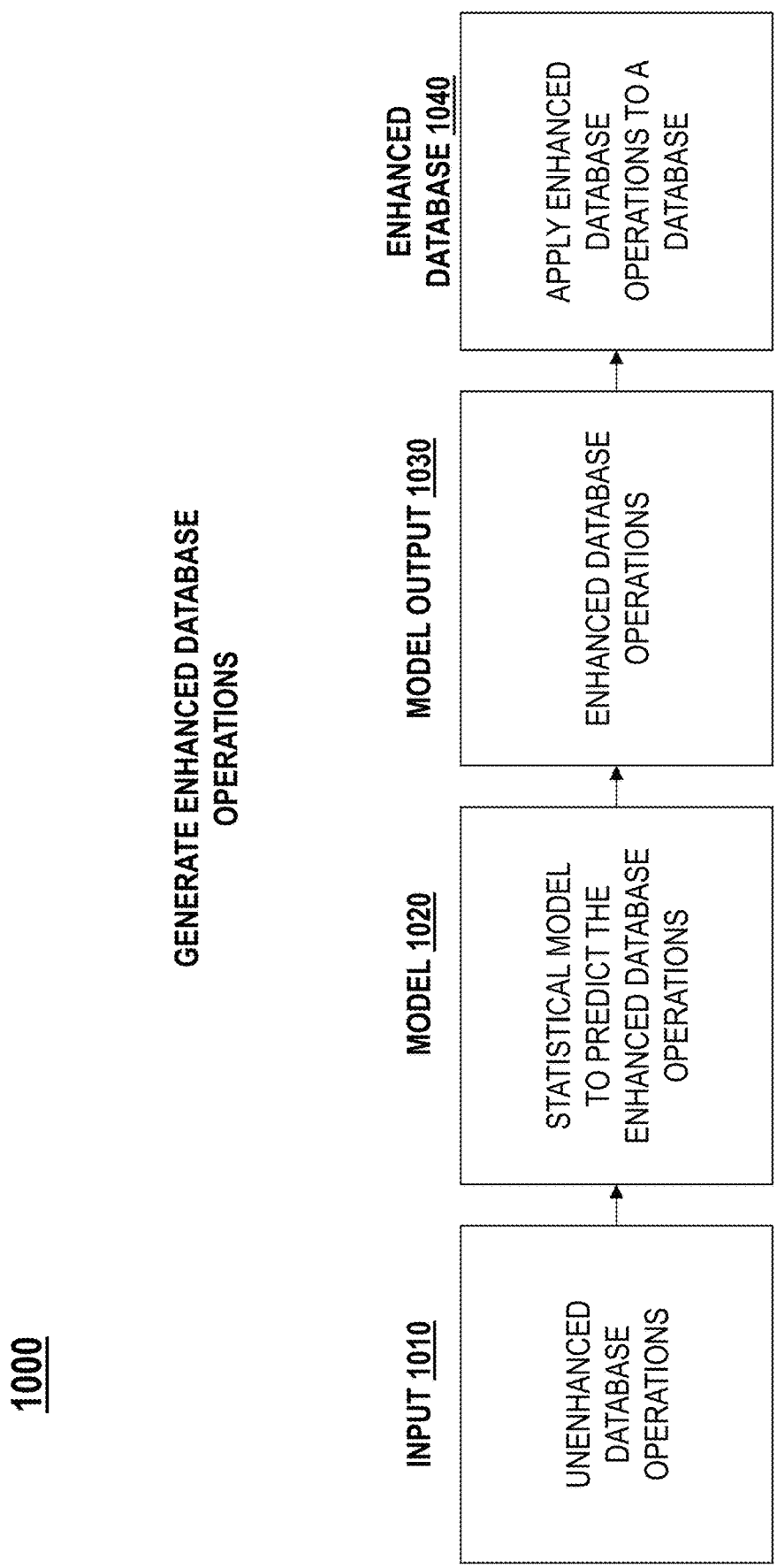
FIG. 10 illustrates an exemplary block diagram for managing a database, in accordance with some embodiments of this disclosure.

FIG. 10 illustrates a diagram 1000 for using a statistical model to determine enhanced database operations, according to embodiments of the present disclosure. For example, the system can receive one or more client requests comprising input data 1010. For example, the client requests can include one or more datasets and unenhanced database operations. Database operations may refer to database commands, such as, but not limited to write and read commands. An unenhanced database operation may refer to a database operation e.g., such as a read or write request that has not been optimized to improve database performance.

The input data 1010 may be input into the model 1020, which outputs enhanced database operations 1030. In one or more examples, the enhanced database operations can correspond to one or more storage locations (e.g., storage locations on one or more disks) to store the data included in the one or more datasets. The system may then apply the enhanced database operations to a database 1040 and return results to a database client. For example, the system can store the data to the storage locations determined by the statistical model and present an indication to the client and/or user that the data was successfully stored. In some examples, observations regarding the model performance and predictions can be collected and used to continuously train the model 1020 to improve model quality and further tailor the database structure to a particular client.

Figure 11:
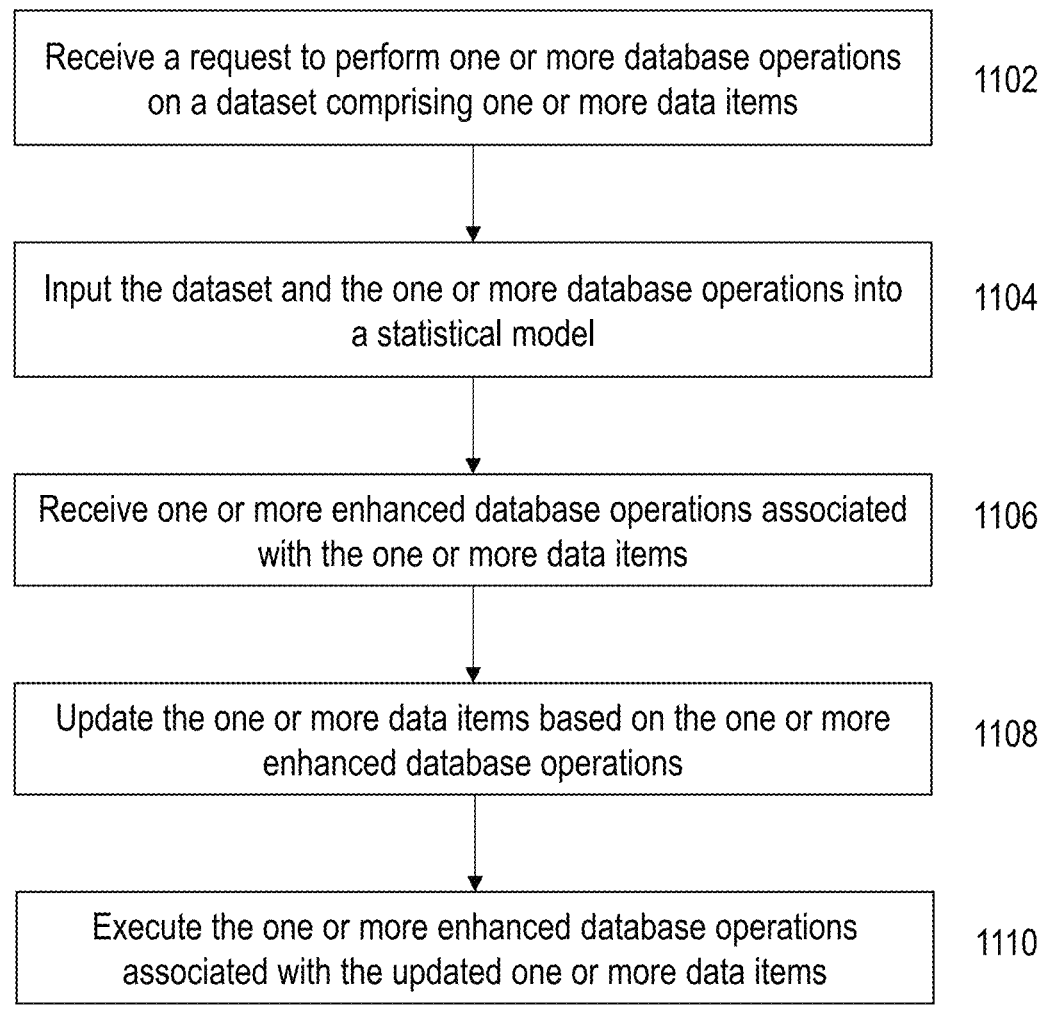
FIG. 11 illustrates an exemplary process for managing a database, in accordance with some embodiments of this disclosure.

FIG. 11 illustrates a flow chart of a process 1100 for determining enhanced database operations according to one or more embodiments of the present disclosure. For example, the process 1100 may be associated with one or more blocks of FIG. 10. Process 1100 is performed, for example, using one or more electronic devices implementing a software platform. In some examples, process 1100 is performed using a client-server system, and the blocks of process 1100 are divided up in any manner between the server and a client device. In other examples, the blocks of process 1100 are divided up between the server and multiple client devices. In other examples, process 1100 is performed using only a client device or only multiple client devices. In process 1100, some blocks are, optionally, combined, the order of some blocks is, optionally, changed, and some blocks are, optionally, omitted. In some examples, additional steps may be performed in combination with the process 1100. Accordingly, the operations as illustrated (and described in greater detail below) are exemplary by nature and, as such, should not be viewed as limiting.

The following description of process 1100 is made with reference to FIGS. 12A-12D. However, the description of process 1100 with respect to these exemplary figures is not intended to limit the scope of this disclosure.

At block 1102 of FIG. 11, the system can receive a request to perform one or more database operations on a dataset comprising one or more database items. The one or more database operations may correspond to one or more unenhanced database operations associated with data items included in the dataset. In some examples, the unenhanced database operation may correspond to a write request from a client and include one or more data objects (e.g., documents, images, strings, etc.) to be written to the database. In some examples, the unenhanced database operation may correspond to query to access one or more data objects stored in the database. As used herein, the terms data objects and data items may be used interchangeably.

FIG. 12A illustrates exemplary input data 1210 comprising a dataset that includes one or more data items (e.g., data objects) where each object item is associated with a database operation. As shown in the figure, each data object includes a database operation type, one or more tags, and one or more time-stamped values. The database operation type may correspond to the requested database operation. As shown in the figure, each data object in input data 1210 is associated with a write request.

At block 1104 of FIG. 11, the system can input the input data (e.g., the dataset and the one or more database operations) into a statistical model. In some instances, the statistical model may be a trained model configured to receive a specific dataset type. For example, some models may be trained to receive time-stamped data, image data, document data, or a combination thereof. In some instances, the model can be configured to receive various types of data. In some instances, the statistical model may be an untrained model configured to learn during run-time. As discussed above, the statistical model may be configured to determine one or more enhanced database operations, such as one or more storage locations to store the data items included in the input data.

For example, with respect to FIG. 12A, the system may input the input data 1210 into a statistical model, e.g., model 1020. The model may be configured to identify one or more storage locations associated with each of the one or more data objects. The storage location may be based on one or more properties associated with the data objects. In some instances, data objects with similar properties may be stored together and/or near each other on disk space within the database. For example, if the data objects are documents, the one or more properties can include but are not limited to, for example, words included in the document, a language of the document, subject matter of the document, length of the document, an author, and the like. In one or more examples, if the data objects are images, the one or more properties could include, but is not limited to, an image size, a date associated with the image, a location associated with the image, and the content of the image.

In some instances, the document property may not be readily apparent and can be separately determined. For example, if the data object is an image, the content of the image may be determined, e.g., via an image recognition model. For example, an image recognition model may be applied to an image and used to determine that the image includes a picture of a cat. The determined content of the image may be appended to the data object of the image, e.g., the data object would be modified with a tag indicating that the image corresponds to a picture of a cat.

In some instances, the document property may include the likelihood that a data object will be included in a specific user query. For example, if the data objects comprise a plurality of images, the images may be stored based on the likelihood that they will co-occur as a result of a query. For example, images of animals may be grouped together, images of buildings may be grouped together, images of people may be grouped together, and the like, as these images are more likely to co-occur in a query.

While a number of examples of various document properties are provided above, these examples are non-limiting, and a skilled artisan will understand that other document properties may be used to determine a storage location of data objects received by the statistical model.

In one or more examples, the property used to determine the storage location may be selected based on one or more desired database objectives. In some embodiments, the client may specify a desired database objective. In some embodiments, the model may automatically determine a database objective, e.g., based on the received input data. The database objectives may include reducing write latency, reducing read latency, reducing storage space, optimizing disk layout, improving data locality, and the like. For example, to reduce a read latency the property used to determine the storage location may correspond to a likelihood that two or more data items would co-occur in a client's query. As another example, to reduce storage space, the property may correspond to a similarity in the content of the data item, e.g., to improve block compression. In some embodiments, the same object property can be evaluated to achieve multiple objectives.

At block 1106 of FIG. 11, the system can receive the one or more enhanced database operations associated with the one or more data items, e.g., output 1030. In some examples, the one or more enhanced database operations may correspond to one or more storage locations, e.g., an enhanced write location, for each of the data items. For example, with reference to FIG. 12B, the model, e.g., model 1020, may predict cluster ids based on the input data 1210 to produce output 1230.

As discussed above, the one or more storage locations may be based on a similarity between the one or more data objects. For example, as shown in output 1230, data objects "object_id": 67890 and "object_id": 1111 are both saved to cluster 100. Thus, the system has determined that these data objects are similar and/or are likely to co-occur in a client query. As discussed above, saving data items that are similar can have numerous benefits, including, but not limited to reducing query latency, reducing write latency, optimizing disk layout, and improving data locality.

At block 1108 of FIG. 11, the system can update the one or more data items based on the enhanced database operations. For example, the system can update the data items based on the storage locations specified by the output of the model. Referring to output 1230 of FIG. 12B, the system can insert the storage location, e.g., cluster ids, into the data objects themselves. Accordingly, the output 1230 provides one or more enhanced database operations by specifying the storage location for each of the data objects.

At block 1110 of FIG. 11, the system can execute the one or more enhanced database operations. For example, the system can store the one or more data items based on the one or more storage locations specified by the output of the model. With reference to the example in FIGS. 12C-12D, the system can execute the enhanced write requests by writing the data items to a sharded database (e.g., a Cassandra database), using the cluster id as the shard id. FIG. 12C illustrates an example post-execution storage state with "object_id": 67890 and "object_id": 1111 written to the same shard; "object_id": 12345 is written to a different shard. As a result, when a client accesses objects 1111 and 67890, only one shard needs to be accessed. Therefore, the predictive system of the model can be used to improve spatial data locality and can reduce query latency.

In contrast, current database indexing systems typically store the data objects based on an object id modulus. For example, FIG. 12D provides an example of the system storing the input data 1210 based on an object_id modulus 2. Using this indexing paradigm, "object_id": 67890 and "object_id": 1111 are stored to different shards. As shown in the figure, "object_id": 1111 and object_id": 12345 are stored together because the object IDs both begin with "1". However, because "object_id": 67890 and "object_id": 1111 are likely to be queried together, a client query that requests data from both these data objects would have to access two different shards, which may increase latency compared to methods disclosed herein.

Accordingly, embodiments of the present disclosure provide methods of enhancing database operations by reducing query latency, improving data locality, and optimizing disk layout. As the number of objects and shards increases, the benefit provided by the methods of this disclosure also increases. For example, given a trillion objects uniformly distributed across one thousand shards, a query that accesses ten percent of the objects will probabilistically need to access all shards. However, with the methods disclosed herein, fewer shards may need to be accessed, due to improved data locality.

In one or more examples, the method may further comprise collecting observations and updating the predictive system. In some instances, the system can analyze objects that have been written to the database and update the model accordingly. For example, referring to FIG. 12E, the system can extract the tag sets from the written data objects as shown in collected observations 1250. The system can then update the model using these collected observations 1250. For example, the system can update the k-means clustering model with the tag sets by adding the collected observations 1250 to the training data for the model. The training data including the collected observations can be used to train the model to produce an updated model which may be used in the enhancement of future database operations. In this manner, the system can continuously re-evaluate the partitions of data and perform rebalancing operations to order to reduce hot and cold spots in the database and improve the operation of the database as discussed above. This provides a customized database that enhances storage efficiency and reduces access latency by continuously updating the model to improve the distribution of data items within the database across storage. That is, as the system collects additional collected observations regarding a database and retrains the model, the model may be further tailored to a database. In some examples, similar databases (e.g., if two databases store a collection of images) may share collected observations to train the model associated with each of the databases.

In one or more examples, after executing the one or more enhanced database operations, the system may receive a query from a client and/or user to retrieve data from a database according to embodiments of this disclosure that has been optimized to reduce query latency. For example, the system may receive a request to read data in the database that includes images of dogs. In such an example, the system may access the data in the database based on an indexing structure corresponding to the data stored in the database based on the enhanced database operations. In such embodiments, because the data has been stored to store images nearby on disk space based on a likelihood that the images will be queried together, the database may perform fewer fetches from disk and/or access fewer blocks of data than a conventional database.

Superindexing Examples

Embodiments of the present disclosure provide numerous advantages over conventional database systems. The following examples of the application of systems and methods of this disclosure are described with respect to one or more of these advantages. These examples are non-limiting and a skilled artisan will understand that other examples may be used without departing from the scope of this disclosure and that each example may confer multiple advantages over conventional databases.

Embodiments of the present disclosure improve upon current database systems by reducing the amount of storage space used, particularly in storage systems that use block compression. This is accomplished by storing similar objects together in storage, which can improve compression ratios at the block level in storage, because compression algorithms benefit when the data being compressed is similar.

Figure 13A:
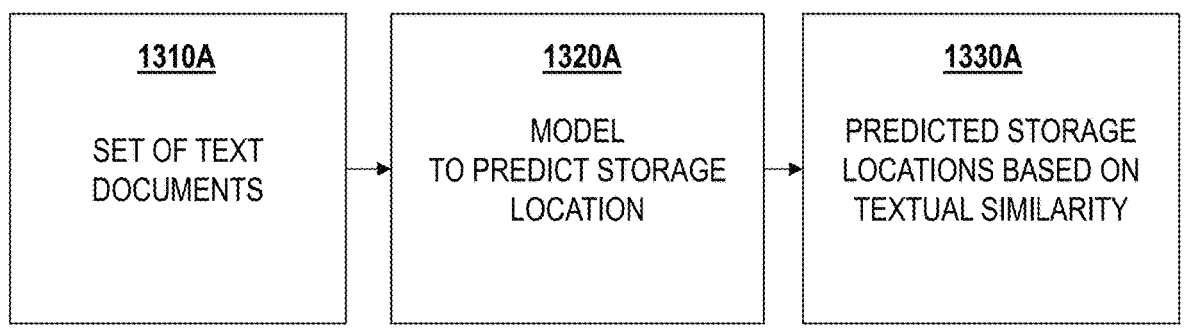
FIGS. 13A-13G illustrate exemplary processes for managing a database, in accordance with some embodiments of this disclosure.

FIG. 13A illustrates an exemplary process diagram according to embodiments of the present disclosure that demonstrates how storage space may be reduced. As shown in the figure, the system can receive a set of text documents and associated metadata at block 1310A. These text documents can be input into a statistical model to predict the appropriate storage location for the documents at block 1320A. As discussed above, the statistical model can be configured to predict a storage location for each of the text documents based on one or more document properties. In one or more examples, the statistical model may use textual similarity (e.g., the Levenshtein distance) to determine the storage location, which is output in block 1330A. As a result, documents with similar text will be co-located in storage (such in the same block in a hard drive). As a result, as each block is compressed (e.g., by gzip or zstandard or another compression algorithm), the compression ratios of the compressed block can be improved, because the data being compressed is more self-similar (each document in the block shares text). In contrast, a traditional method would store a given dataset of text documents in storage according to their primary key (such as a random string like a universal unique identifier).

Embodiments of the present disclosure further provide improvements to database operations by reducing query latency. For example, the model can determine a likelihood that the data objects are likely to co-occur in query responses and the system can store the data-objects in storage based on this likelihood. When a query is received to fetch the data items from storage, the system can perform fewer fetches to access the data compared to conventional database structures.

For example, given a dataset of images used in a visual search engine (in which users enter keywords, and images are returned as results), a conventional database can store each image according to its internal identifier (such as image URL). Thus, according to conventional database, each image would be stored according to that URL key (which is arbitrary). When query results are returned, fetching those highly scattered images will result in many random seek operations. For example, each random seek would fetch a block from storage, access the relevant image, then discard the remainder of the storage block. Such a process can be inefficient and lead to longer query latency times and increase the amount of processing power consumed.

Figure 13B:
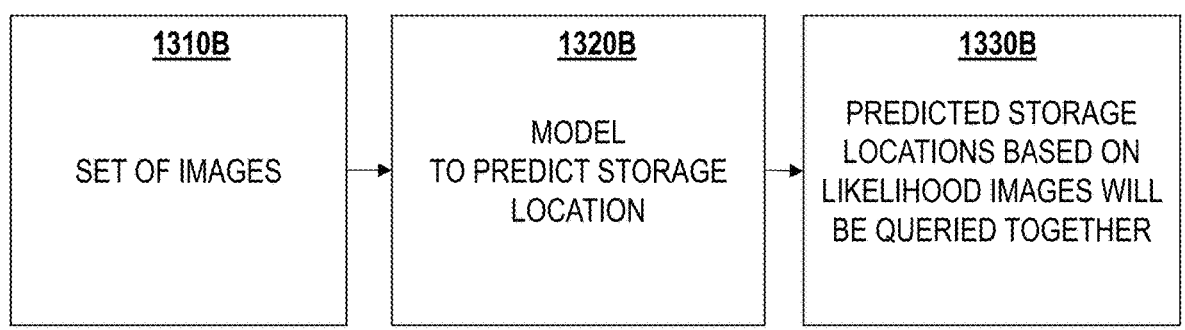

FIG. 13B illustrates an exemplary process diagram according to embodiments of the present disclosure that demonstrates how embodiments of the present disclosure may reduce query latency. As shown in the figure, the system can receive a set of images at block 1310B. The set of images can be input into a statistical model to predict the appropriate storage location for the images at block 1320B. As discussed above, the statistical model can be configured to predict a storage location for each of the images based on one or more document properties at block 1330B. For example, the data object property can correspond to a likelihood that an image will be included in one or more queries. In some instances, the model can convert keyword queries into image results, to analyze the images and cluster them together in storage based on their similarity. In some examples, a separate model may convert the keyword queries into image results and feed the results into the statistical model. These images can then be co-located on storage disk blocks according to their probability of being retrieved together in queries. For example, images of dogs can be stored together because queries for anything dog-like will likely fetch those images; pictures of cats can be stored together, and so on. Accordingly, if the database receives a query related to images with dogs, the database can access the corresponding storage block as opposed to accessing multiple storage blocks as with conventional database indexing systems where the images responsive to the query are stored over these multiple storage blocks.

Embodiments of the present disclosure can further improve the operation of a database by reducing write latency by using the model to store data objects closer to their final destination in storage, thereby avoiding computationally expensive compaction operations. For example, when receiving a write request for an object, conventional databases perform for multiple compaction operations to "percolate" the results to their final location on disk. Traditional compactions are internal database operations that reorganize database objects in storage using sorting or rebalancing operations. The purpose of compactions is usually to reclaim unused space and improve query efficiency. For example, in conventional LSM tree systems, compactions are used to reduce the number of LSM tree blocks that need to be searched in a query. For instance, inserting a new string into an existing database according to conventional database operations can typically write the string to a fixed location (such as the head of a binary heap, or the main-memory component of an LSM tree) and then iteratively migrate the string closer and closer to the final storage location in which it should reside.

Figure 13C:
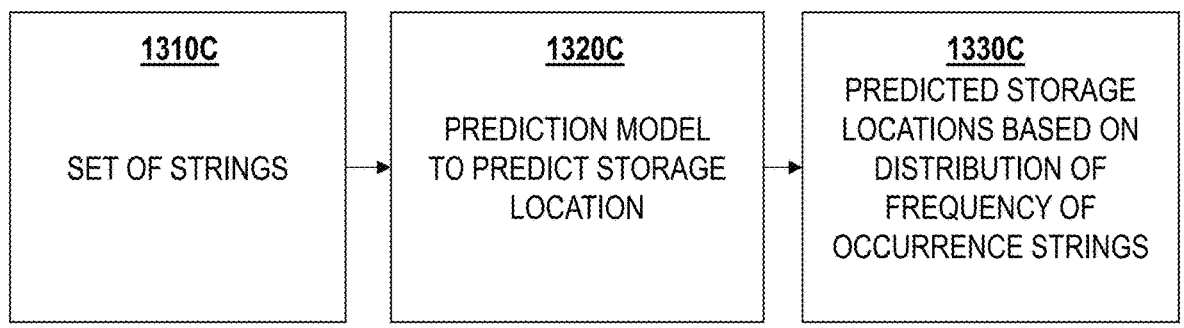

In contrast, embodiments in accordance with the present disclosure can initially store the object statistically closer to where the data object belongs in storage, instead of performing multiple compaction operations. FIG. 13C illustrates an exemplary process diagram according to embodiments of the present disclosure that demonstrates how embodiments of the present disclosure may reduce write latency. As shown in the figure, the system can receive a set of strings at block 1310C. The set of strings can be input into a statistical model to predict the appropriate storage location for the strings at block 1320C. For example, embodiments of the present disclosure can build a statistical model of the set of strings to be stored in the database, where given a set of keywords extracted from a corpus of text documents, the model can stream each keyword through a reservoir sampler to obtain an estimate of the frequency of occurrence of the various strings and the overall distribution of the strings. In some examples, the model can use a string density model (e.g., a statistical model that can be used to answer various probabilistic questions about the data). This model can be used to determine, given a new string S, how many strings in the database are less than this string, where "less than" would mean a string would appear before the new string, if the strings were sorted, e.g., as in a spelling dictionary.

A conventional method would query the database itself to answer this question, which would be slow, instead of using the model. At block 1330C, the model can make a prediction of where the data should be stored. This prediction will be used to write the new string into the storage system directly at the particular location in storage. For example, if the model determined that 20% of the dataset sorts less than the new string, the string would be at an array position near the 20% mark. Thus, embodiments in accordance with the present disclosure can perform constant-time compactions, in contrast to traditional methods that require linear-time, polynomial-time, or even exponential-time compactions.

Embodiments of the present disclosure can further solve database problems involving high-dimensional data, in which the sheer number of columns (e.g., "fields") degrades performance of traditional database operations. For example, consider a table (or sparse matrix) that contains one trillion columns and billions of rows, in a document retrieval system. In the document retrieval system, each column may correspond to a keyword, and each row corresponds to the document where the keywords appear. In such an example, each document may contain one thousand keywords, which implies that many of the column values will be NULL for each row. In one or more examples, the system may receive a request to fetch one or more documents that contain a given set of query keywords where each query keyword can be mapped to a column identifier, the column can be fetched from storage, and the fetched columns can be intersected to find the documents in which all keywords in the query occur.

Using a conventional method, the column identifiers are random, arbitrary, or assigned according to the sorted order of the keywords. As a result, querying for arbitrary sets of keywords may cause the database to fetch many columns from storage—each requiring an expensive seek operation, where the seek operation corresponds to a random lookup in storage to retrieve a block of data from disk or a file from cloud object storage systems. This process is inefficient, consuming a lot of time and processing power.

Figure 13D:
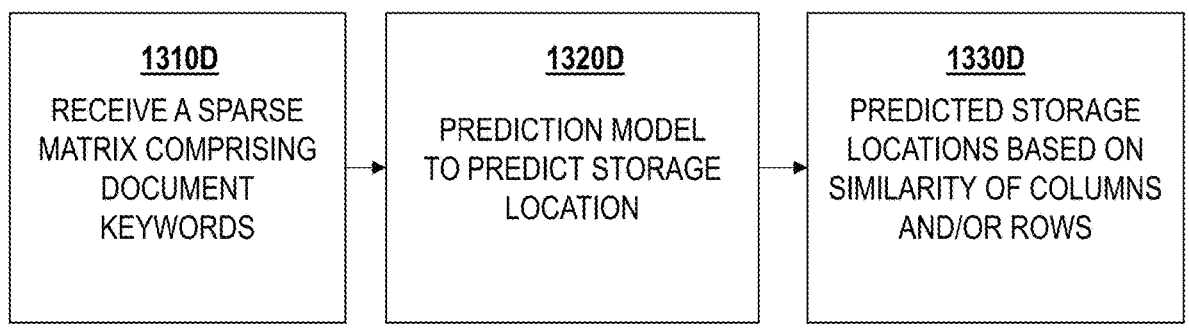

In contrast, embodiments in accordance with the present disclosure can initially analyze the columns using a statistical model to determine a similarity of the columns and predict a storage location for each of the columns based on the predicted similarity. FIG. 13D illustrates an exemplary process diagram according to embodiments of the present disclosure that demonstrates how embodiments of the present disclosure process and store high dimensional data. As shown in the figure, the system can receive a sparse matrix comprising document keywords at block 1310D. The sparse matrix can be input into a statistical model to predict the appropriate storage location for the columns associated with the keywords at block 1320D. The statistical model may be configured (e.g., trained) to determine the similarity of the columns, such as by clustering the columns based on which keywords co-occur in documents, e.g., using the TF-IDF distance measure. The system can then use these predictions at Block 13030D to then store the columns in storage grouped together by the cluster identifier assigned by the model. In this manner, queries for sets of keywords will tend to make many fewer disk seeks to find the column data because examples of this disclosure store related database objects together in the storage blocks.

As another example of performing database operations on high dimensional data, embodiments of the present disclosure may provide improvements over conventional database systems when handling the "million-seek problem." In the million-seek problem, in which the database, in response to a query, should retrieve one million items from a dataset of size one trillion, from a storage system using block-oriented storage (e.g., shards) where each block contains one million items (e.g., one million shards, multiplied by one million items per shard, equals one trillion items).

Using conventional database storage operations, the database can store each item in storage blocks according to an arbitrary identifier (e.g., a hash value, timestamp, and the like). As a result, a query that requests one million items from a database of one million shards, may require fetching many or all the shards in storage to satisfy the query. In this example, the system would perform one million fetches from storage, which is potentially incredibly slow; at 0.1 milliseconds per seek (as is common with modern hard drives). Accordingly, it would take one hundred seconds to fetch all the shards, even though only one out a of million items (0.0001%) were relevant to answer the query.

In contrast, embodiments of the present disclosure could achieve much more efficient performance. In one or more examples, the model can analyze the dataset for internal structure, and/or analyze queries to find trends, to determine clusters of related items. The model can output its predicted clusters or storage locations for the columns for the system to then co-locate the columns proactively into shards based on the output of the model. In this manner, systems and methods in accordance with embodiments of the present disclosure would fetch significantly less shards. For example, for a particular query, the system may fetch only one shard from storage, resulting in a query time of 0.1 milliseconds, which is a speedup over traditional methods of a factor of one million.

Figure 13E:
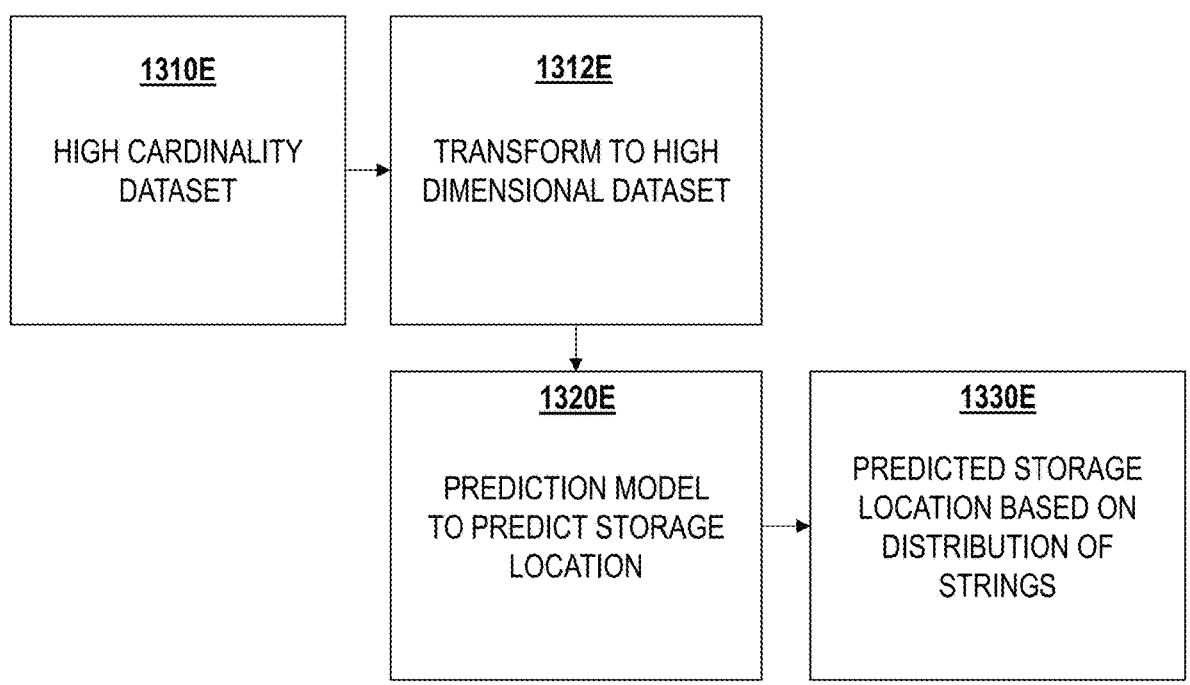

Embodiments of the present disclosure further address issues associated high-cardinality data with respect to database operations. For example, embodiments of the present disclosure manage high-cardinality data by converting the high-cardinality dataset into a high dimensional dataset and handling the high-dimensional dataset as described above. For instance, as shown in FIG. 13E, the system can receive a high cardinality dataset at block 1310E. At block 1312E, the system can transform the high cardinality dataset to a high dimensional dataset, for example, by assigning each distinct value in the original high cardinality to a column and each row stores the values that co-occur. At block 1320E, the system can input the transformed dataset into the prediction model to predict a storage location for each of the columns. At block 1330E, the system can output the predicted locations based on the model. The system can then store the columns of the transformed dataset based on the predicted output at block 1330E.

Embodiments of the present disclosure can further improve database operations by using combinatorial optimization. For example, conventional databases struggle to perform database operations (e.g., read and write operations) on datasets where each data object is a point in 100-dimensional Euclidean space. Using conventional database operations, a conventional database would use a high-dimensional tree structure to provide axis-aligned bounding box (AABB) query support, which incurs large amounts of random seek operations in storage when traversing the high-dimensional data.

Figure 13F:
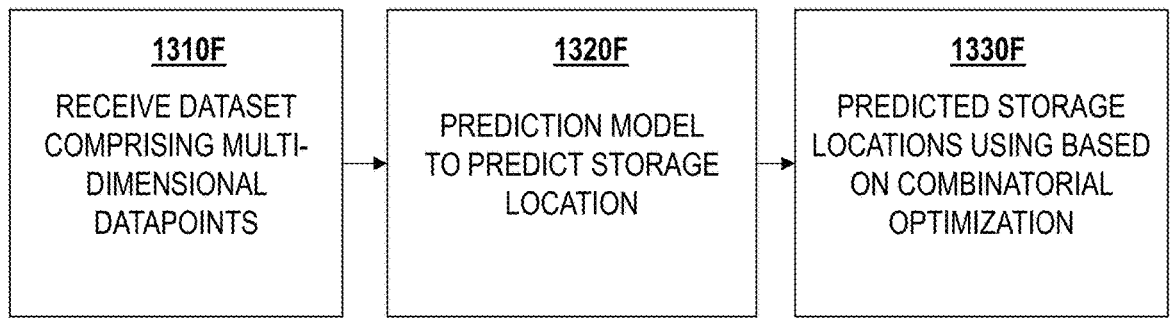

Embodiments of the present disclosure can use combinatorial optimization to create a storage layout that is much more amenable to sequential access patterns (which, in contemporary storage media like hard drives, can be one to two orders of magnitude faster than random seek operations). FIG. 13F illustrates an exemplary process diagram according to embodiments of the present disclosure that demonstrates how embodiments of the present disclosure can process and store multi-dimensional data. As shown in the figure, the system can receive a sparse matrix comprising multi-dimensional datapoints at block 1310F. The dataset can be input into a statistical model to predict the appropriate storage location for the columns associated with the keywords at block 1320F. For example, statistical models in accordance with the present disclosure can use the Traveling Salesman Problem (TSP) (e.g., which finds a short one-dimensional path among multidimensional points) to transform a multidimensional dataset into a one-dimensional dataset. The one-dimensional dataset can be used to determine the predicted storage locations of the datapoints based on the use of combinatorial optimization at block 1330F. This dimensionality reduction of the dataset facilitates sequential access to improve query processing speed. In some instances, embodiments of the present disclosure can augment each point of the form (x0, x1, x2, . . . , xn) with a storage key, such that the storage keys form a useful ordering of the points (e.g., using the key-value sets as described above). In some instances, combinatorial optimization can be used to perform dimensionality reduction on the dataset, for the purpose of optimizing sequential disk access.

Embodiments of the present disclosure can further identify structure in a dataset to optimize storage layout. In one or more examples of the present disclosure, the system can write the model-derived structure to storage and use the resulting data structures during querying. Embodiments of the present disclosure can generate database structures based on one or more clusters of data within a dataset as well as based on the relationship between the clusters of data.

Figure 13G:
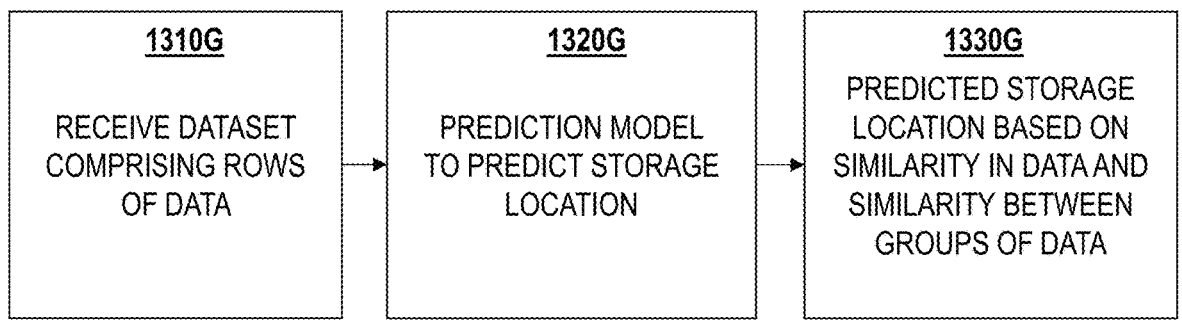

FIG. 13G illustrates an exemplary process diagram according to embodiments of the present disclosure. As shown in the figure, the system can receive a dataset comprising rows of data at block 1310G. The dataset can be input into a statistical model to predict the appropriate storage location for at block 1320G. In one or more examples, the statistical model can be an unsupervised model trained on the received rows of the dataset. The statistical model can output a hierarchy of clusters of the rows based on similarities between the data included in the rows (for example, the model algorithm may be Agglomerative Clustering, OPTICS, DBSCAN, HDBSCAN, and so on) at block 1330G. In some examples, the model can natively output a tree of groups that describes the relationship between the clusters. Accordingly, embodiments of the present disclosure can write the dataset to storage in accordance with the model-derived groups, and in accordance with the model-derived relationship between groups. Accordingly, embodiments of the present disclosure can be used to directly to generate database structures and data structures from models.

In one or more examples, the model can output a decision tree or decision forest trained on the dataset. In such examples, the models can generate, at each level of the trees, a decision that can be used to traverse the tree to find a value. Therefore, by using models according to embodiments disclosed herein, methods in accordance with this disclosure can outperform multidimensional data structures like kd-trees, because the model makes statistically-informed decisions about which dimension to "split" on at each level in the search tree, instead of relying on hardcoded choices (as is the case in a kd-tree, where the dimensions to be compared are fixed: $dim_0$, $dim_1$, $dim_2$, $dim_0$, $dim_1$, $dim_2$, . . . ).

Training the Statistical Model

In some embodiments, the statistical model to predict enhanced database operations (e.g., model 1020) can be a trained statistical model. In one or more examples, the system can train a model to be applied to a plurality of databases and types of datasets. In one or more examples, the system can train a plurality of models where each model is trained to enhance the database operations for a specific type of data. In such examples, when the system receives a dataset to be stored to the database, the system can select the appropriate model based on the data included in the dataset. In some embodiments, the model may be an untrained model configured to train at runtime.

Figure 14:
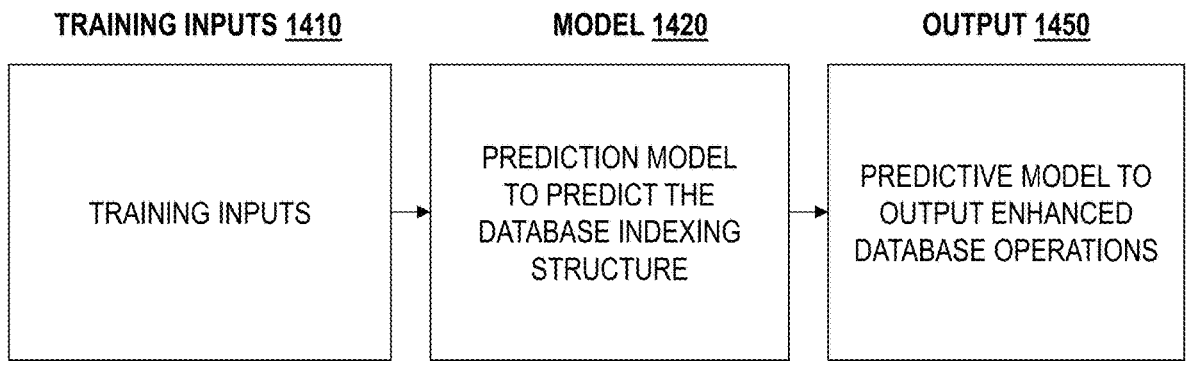
FIG. 14 illustrates an exemplary process for training a statistical model, in accordance with some embodiments of this disclosure.

FIG. 14 illustrates a flow chart of a process 1400 for training a statistical model for determining enhanced database operations, according to embodiments of the present disclosure. Process 1400 can define and train a model based on any available information that the database system, or operator, may deem relevant.

Figure 15:
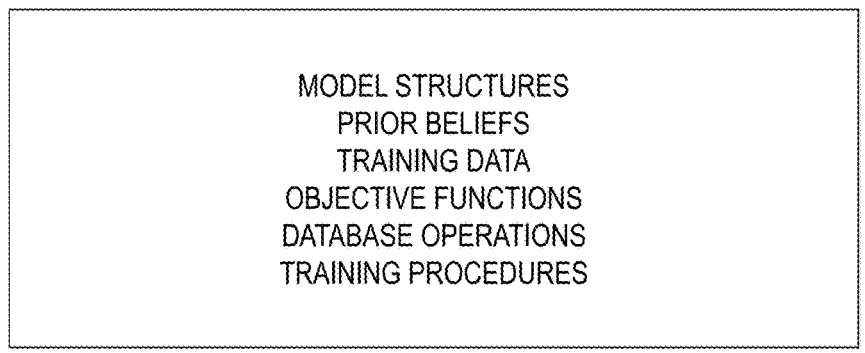
FIG. 15 illustrates exemplary training inputs for training a statistical model, in accordance with some embodiments of this disclosure.

Block 1410 of FIG. 14, shows one or more training inputs 1410 to be input into the model 1420 for training. As shown in FIG. 15, the one or more training inputs 1510 can include prior beliefs, model structures, training data, objective functions, database operations, and model training procedures. In one or more examples, the training inputs 1510 can correspond to training inputs 1410. By inputting the inputs 1410 into the model is to specify the model and the inputs that would influence the creation of the model.

In some examples, the model structure can include, for example, but is not limited to, a clustering model, a regression model, a classification model, a reinforcement learning model, a deep learning model, a Bayesian network model, a sampling model, and the like. In some examples, the hyper-parameters for the model, can include the starting values for parameters to be fit by the model training process. In some examples, the prior beliefs can include the expected distribution of data and/or constraints placed on the statistical model. For example, the expected distribution of data can include, but is not limited to, uniform distributions, Gaussian distributions, exponential family distributions. The constraints may be placed on the model (e.g., deep learning neural network nodes) to improve interpretability, hierarchical Bayesian Network priors, Markov Networks, and the like.

In some examples, the training dataset can include one or more datasets. In some examples, the training dataset may be similar to the type of data that will be input into the model during run-time. For example, a model may be trained to store a plurality of images; and during run time this model can receive one or more images. In some examples, the training data may not be similar to the type of data that will be input into the model. For example, the model may be trained on rows of data and during run time can receive a sparse data matrix, documents, images, etc.

In some examples, the training inputs 1410 can include the set of observations collected by previous runs of the system, by human operators, or by third parties. The set of observations may be used for continuously trained models. For example, the training inputs 1410 can include metrics collected about database query response times. In some examples, the training inputs 1410 can include mechanisms to train the model, such as, but not limited to, single-CPU, distributed computation, GPUs, AI accelerators, SIMD, and the like.

In one or more examples, the system can train a k-means clustering model that will assign a cluster identifier to any combination of tags provided as input. According to this example, the training inputs received at block 1410 may include a model structure corresponding to a k-means clustering model; the training data can include a "bag of words" representation, where each word is a tag key-value set (such as "sensor=42"); the prior beliefs can include the assumption that the data should have a uniform distribution. The training procedures can include an 80/20 test and validation data split. In this example, implicit objective of the modeling process can be assigning objects that will be queried together to similar clusters.

FIG. 16 illustrates exemplary training data 1612 (e.g., training input data 1410) that can be used to train a model along with other training input data. As shown in the figure, training data can include a plurality of key value sets.

At block 1420 the statistical model can receive the one or more training inputs 1410, e.g., including training data 1612. After the model 1420 receives the inputs 1410, the model may invoke the model training procedures specified in the training inputs 1410 and apply these model training procedures on the remaining inputs, e.g., training data, prior beliefs, etc. In one or more examples, the model 1420 may be an untrained model. In one or more examples, the model 1420 may be a continuously trained model.

Referring back to the example of the training process to train a k-means clustering model, the model may use an unsupervised clustering algorithm (such as Latent Dirichleit Allocation) that assigns each database object to a cluster. In such examples, the model can determine an enhanced database operation where each cluster would be stored together in storage (such as in a shard or data partition). FIG. 16B illustrates an exemplary output 1630 of the statistical model during the training process according to embodiments of this disclosure. As shown in the figure, the output 1630 can include the cluster identifiers ("cluster_id") for each of the data objects.

In some examples, the model may use internal distance functions to compare database objects (such as Euclidean distance for coordinate data, term-frequency-inverse-document-frequency (TF-IDF) for text documents, or the Manhattan distance for bitvectors). In some examples, the model may use dimensionality reduction algorithms on database objects, such as Singular Value Decomposition (SVD) or Latent Dirichleit Allocation (LDA), in order to find patterns in the data and improve predictions.

In some examples, the model may use observations from past activity of the database system, such as seasonal or trending query patterns (such as during a sales event like Black Friday), to train the model to pro-actively increase system resources (such as by automatically allocating additional bandwidth, storage, or cache capacity from a cloud hosting provider).

In some examples, the model may use pessimistic prior beliefs, such as by assuming that queries in the system will be adversarial (intended to trigger worst-case performance, as in a denial-of-service attack). In such a situation, the model can output adversary-defeating data storage decisions. For example, the system can randomize data storage decisions to reduce "hot spots" or "cold spots," regardless of the database operations the system receives.

In some examples, the model may use causal reasoning.

In some examples, the model may be completely untrained at initialization and learn during run-time. For example, this may provide a "just-in-time (JIT)" database system, where the database continually adapts to the current state of the system and the observed quality of recent database operations.

In some examples, the model may be completely trained at initialization, and not complete additional learning during run-time, e.g., continuous learning. For example, using a trained model without continuous learning can be used when defending a database system against adversarial queries, by enforcing a zero-knowledge (uniform distribution) prior belief on how to arrange database objects in storage. As another example, using a trained model without continuous learning can be used when building write-once data structures such as LSM tree file segments. With LSM tree file segments, each segment typically has a bulk construction phrase, followed by a read-only phase. Accordingly, the model training would occur at initialization.

At block 1450 of FIG. 14, the system can output a predictive model for predicting enhanced database operations. For example, the output 1450, may be configured to receive unenhanced database operations as input and determine enhanced database operations as an output. In some examples, the model output at 1450 can correspond to the predictive model 1020 described above with respect to FIG. 10.

To the extent that the processes above are described with respect to specific figures and examples, these processes are not limited to the example described herein and can extend to other applications.

Figure 17:
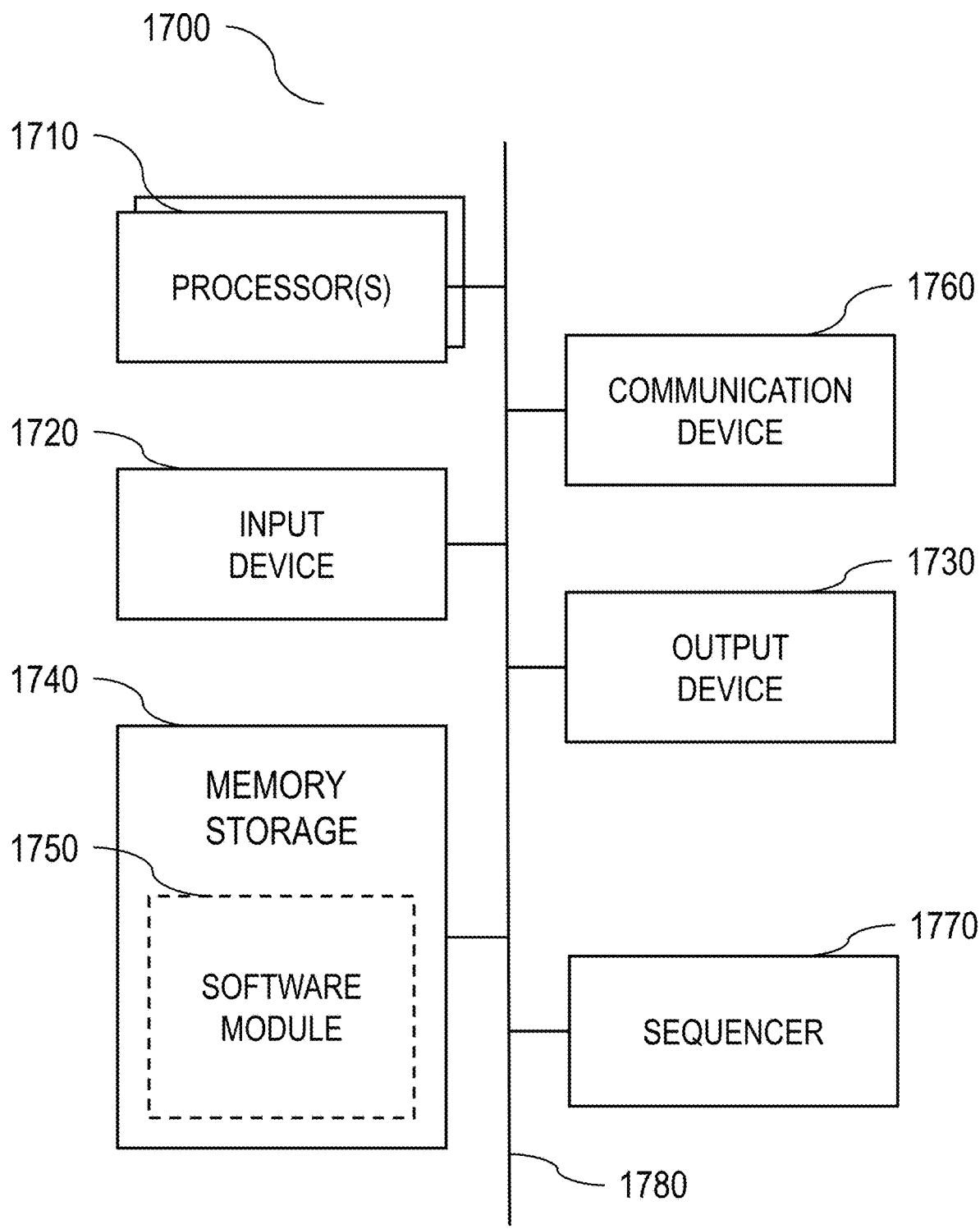
FIG. 17 illustrates an exemplary electronic device, in accordance with embodiments of this disclosure.

The operations described above with reference to the figures are optionally implemented by components depicted in FIG. 17. It would be clear to a person having ordinary skill in the art how other processes are implemented based on the components depicted in FIG. 17.

FIG. 17 illustrates an example of a computing device in accordance with one embodiment. Device 1700 can be a host computer connected to a network. Device 1700 can be a client computer or a server. As shown in FIG. 17, device 1700 can be any suitable type of microprocessor-based device, such as a personal computer, workstation, server or handheld computing device (portable electronic device) such as a phone or tablet. The device can include, for example, one or more of processor 1710, input device 1720, output device 1730, storage 1740, and communication device 1760. Input device 1720 and output device 1730 can generally correspond to those described above, and can either be connectable or integrated with the computer.

Input device 1720 can be any suitable device that provides input, such as a touch screen, keyboard or keypad, mouse, or voice-recognition device. Output device 1730 can be any suitable device that provides output, such as a touch screen, haptics device, or speaker.

Storage 1740 can be any suitable device that provides storage, such as an electrical, magnetic or optical memory including a RAM, cache, hard drive, or removable storage disk. Communication device 1760 can include any suitable device capable of transmitting and receiving signals over a network, such as a network interface chip or device. The components of the computer can be connected in any suitable manner, such as via a physical bus or wirelessly.

Software 1750, which can be stored in storage 1740 and executed by processor 1710, can include, for example, the programming that embodies the functionality of the present disclosure (e.g., as embodied in the devices as described above).

Software 1750 can also be stored and/or transported within any non-transitory computer-readable storage medium for use by or in connection with an instruction execution system, apparatus, or device, such as those described above, that can fetch instructions associated with the software from the instruction execution system, apparatus, or device and execute the instructions. In the context of this disclosure, a computer-readable storage medium can be any medium, such as storage 1740, that can contain or store programming for use by or in connection with an instruction execution system, apparatus, or device.

Software 1750 can also be propagated within any transport medium for use by or in connection with an instruction execution system, apparatus, or device, such as those described above, that can fetch instructions associated with the software from the instruction execution system, apparatus, or device and execute the instructions. In the context of this disclosure, a transport medium can be any medium that can communicate, propagate or transport programming for use by or in connection with an instruction execution system, apparatus, or device. The transport readable medium can include, but is not limited to, an electronic, magnetic, optical, electromagnetic or infrared wired or wireless propagation medium.

Device 1700 may be connected to a network, which can be any suitable type of interconnected communication system. The network can implement any suitable communications protocol and can be secured by any suitable security protocol. The network can comprise network links of any suitable arrangement that can implement the transmission and reception of network signals, such as wireless network connections, T1 or T3 lines, cable networks, DSL, or telephone lines.

Device 1700 can implement any operating system suitable for operating on the network. Software 1750 can be written in any suitable programming language, such as C, C++, Java or Python. In various embodiments, application software embodying the functionality of the present disclosure can be deployed in different configurations, such as in a client/server arrangement or through a Web browser as a Web-based application or Web service, for example.

Although the disclosure and examples have been fully described with reference to the accompanying figures, it is to be noted that various changes and modifications will become apparent to those skilled in the art. Such changes and modifications are to be understood as being included within the scope of the disclosure and examples as defined by the claims.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the techniques and their practical applications. Others skilled in the art are thereby enabled to best utilize the techniques and various embodiments with various modifications as are suited to the particular use contemplated.

The invention claimed is:

1. A computer-implemented method for managing a database and performing a database operation comprising:
    receiving a request to perform one or more database operations on a dataset comprising one or more data items;
    inputting the dataset into a clustering model, wherein the clustering model is configured to identify one or more storage locations associated with the one or more data items based on a similarity between one or more properties of the one or more data items;
    receiving the one or more storage locations associated with the one or more data items;
    updating the one or more data items based on the received one or more storage locations; and
    performing the one or more database operations on the one or more updated data items based on the one or more storage locations.

2. The method of claim 1, wherein the one or more database operations comprises a storage operation.

3. The method of claim 1, further comprising generating a database indexing structure based on the received one or more storage locations.

4. The method of claim 1, wherein the clustering model is configured to group the one or more data items into one or more clusters based on the similarity between the one or more properties, and wherein the one or more storage locations is further based on a relationship between the one or more clusters.

5. The method of claim 1, further comprising determining a property of a data item of the one or more data items.

6. The method of the claim 5, wherein determining the property comprises inputting the one or more data items into a further statistical model to determine the property.

7. The method of claim 5, wherein the property comprises at least one of a content of the data item, a term frequency-inverse document frequency (TF-IDF) of the data item, a value indicative of a textual similarity of the data item to a second data item, a likelihood of co-occurrence of the one or more data items in a client query, or a combination thereof.

8. The method of claim 1, wherein the similarity between the one or more properties of the one or more data items comprises a likelihood of co-occurrence of the one or more data items in a client query.

9. The method of claim 1, further comprising collecting one or more performance metrics of the clustering model based on at least one of a performance of the clustering model during the storing the one or more updated data items and a performance of the clustering model during a subsequent database operation.

10. The method of claim 9, further comprising training the clustering model based on the collected one or more performance metrics.

11. The method of claim 1, wherein the clustering model is an untrained clustering model.

12. The method of claim 1, further comprising:
    inputting training inputs into an untrained clustering model; and
    training the untrained clustering model using the training inputs to obtain the clustering model.

13. The method of claim 12, wherein the training inputs comprises one or more model structures, one or more prior beliefs, training data, one or more objective functions, one or more database operations, and one or more training procedures.

14. The method of claim 13, wherein the one or more model structures comprise, a regression model, a classification model, a reinforcement learning model, a deep learning model, a Bayesian network model, a sampling model, or a combination thereof.

15. The method of claim 13, wherein the one or more prior beliefs comprise an expected distribution of data, constraints placed on the clustering model, or a combination thereof.

16. The method of claim 12, wherein the training data corresponds to a first data type and the dataset corresponds to a second data type, the second data type different from the first data type.

17. A system for managing a database, comprising:
    one or more processors;
    a memory; and
    one or more programs, wherein the one or more programs are stored in the memory and configured to be executed by the one or more processors, the one or more programs including instructions for:
        receiving a request to perform one or more database operations on a dataset comprising one or more data items;
        inputting the dataset into a clustering model, wherein the clustering model is configured to identify one or more storage locations associated with the one or more data items based on a similarity between one or more properties of the one or more data items;
        receiving the one or more storage locations associated with the one or more data items;
        updating the one or more data items based on the received one or more storage locations; and
        performing the one or more database operations on the one or more updated data items based on the one or more storage locations.

18. A non-transitory computer-readable storage medium storing one or more programs, the one or more programs comprising instructions, which when executed by one or more processors of one or more electronic devices, cause the electronic devices to perform a method comprising:
    receiving a request to perform one or more database operations on a dataset comprising one or more data items;
    inputting the dataset into a clustering model, wherein the clustering model is configured to identify one or more storage locations associated with the one or more data items based on a similarity between one or more properties of the one or more data items;
    receiving the one or more storage locations associated with the one or more data items;
    updating the one or more data items based on the received one or more storage locations; and
    performing the one or more database operations on the one or more updated data items based on the one or more storage locations.

19. The computer-implemented method of claim 1, wherein the dataset is a key-value set.

* * * * *